(12) United States Patent
Young et al.

(10) Patent No.: US 10,037,403 B2
(45) Date of Patent: Jul. 31, 2018

(54) METHOD AND SYSTEM FOR MANAGING AIRCRAFT PARTS

(71) Applicant: The Boeing Company, Chicago, IL (US)

(72) Inventors: Stephen Michael Young, Mill Creek, WA (US); Carl Aaron Davison, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 1123 days.

(21) Appl. No.: 14/153,374

(22) Filed: Jan. 13, 2014

(65) Prior Publication Data

US 2015/0199470 A1 Jul. 16, 2015

(51) Int. Cl.
*G06F 17/50* (2006.01)

(52) U.S. Cl.
CPC ...... *G06F 17/5086* (2013.01); *G06F 17/5095* (2013.01)

(58) Field of Classification Search
CPC .. G06F 17/5086; G06F 17/5095; G06F 19/00; G06T 17/005; G06T 17/50
USPC .......................................................... 700/98
See application file for complete search history.

(56) References Cited

U.S. PATENT DOCUMENTS

| | | | |
|---|---|---|---|
| 6,016,487 A * | 1/2000 | Rioux | G06F 17/3025 707/743 |
| 6,985,835 B1 | 1/2006 | Etzion et al. | |
| 7,043,408 B2 | 5/2006 | Camiener et al. | |
| 8,429,174 B2 * | 4/2013 | Ramani | G06F 17/30259 345/419 |
| 2002/0188622 A1 | 12/2002 | Wallen et al. | |
| 2002/0194581 A1 | 12/2002 | Keener | |
| 2003/0050726 A1 * | 3/2003 | Jaffrey | G05B 19/4097 700/182 |
| 2003/0115026 A1 | 6/2003 | Kuzumaki et al. | |
| 2003/0115172 A1 | 6/2003 | Mangalvedhekar | |
| 2003/0163605 A1 | 8/2003 | Abercrombie et al. | |
| 2004/0267401 A1 | 12/2004 | Harrison | |
| 2005/0071135 A1 | 3/2005 | Vredenburgh et al. | |
| 2005/0102050 A1 | 5/2005 | Richey | |
| 2006/0206225 A1 | 9/2006 | Wright | |
| 2007/0288119 A1 | 12/2007 | Wright | |

(Continued)

*Primary Examiner* — Kenneth M Lo
*Assistant Examiner* — Sivalingam Sivanesan
(74) *Attorney, Agent, or Firm* — Yee & Associates, P.C.

(57) ABSTRACT

A system and method for managing a desired part. A manufacturing system comprises a product lifecycle management tool configured to retrieve from a database based on a number of search parameters. The product lifecycle management tool is further configured to define, for each of retrieved part models, a prism having a volume that contains a volume of a part corresponding to the each of the retrieved part models. The product lifecycle management tool is further configured to display on a display system an assembly model including a three-dimensional view of candidate parts using the retrieved part models arranged in positions relative to each other. The candidate parts in the three-dimensional view are displayed in a side-by-side configuration in an order based on a number of characteristics of each prism such that a part model that most closely matches the desired part may be identified and selected for reuse.

20 Claims, 20 Drawing Sheets

(56) References Cited

U.S. PATENT DOCUMENTS

| | | | |
|---|---|---|---|
| 2008/0269942 A1* | 10/2008 | Free | G06F 17/50 700/182 |
| 2009/0052787 A1* | 2/2009 | Satoh | G06Q 30/0643 382/225 |
| 2013/0194263 A1* | 8/2013 | Sakurai | G06T 17/005 345/420 |

* cited by examiner

FIG. 12

ENTER PROFILE SEARCH CRITERIA

| NAME | LOWER BOUND | UPPER BOUND | NAME | LOWER BOUND | UPPER BOUND |
|---|---|---|---|---|---|
| DETAIL (PARTS) | | | R (IN) | | |
| WEIGHT (LBS) | | | R1 (IN) | | |
| LENGTH (IN) | | | R2 (IN) | | |
| A (IN) | | | R3 (IN) | | |
| B (IN) | | | R4 (IN) | | |
| F (IN) | | | R5 (IN) | | |
| N (DEG) | | | R6 (IN) | | |
| T (IN) | | | R7 (IN) | | |
| T1 (IN) | | | AREA (IN2) | | |
| T2 (IN) | | | WETTED_AREA (IN2) | | |

1200

1202

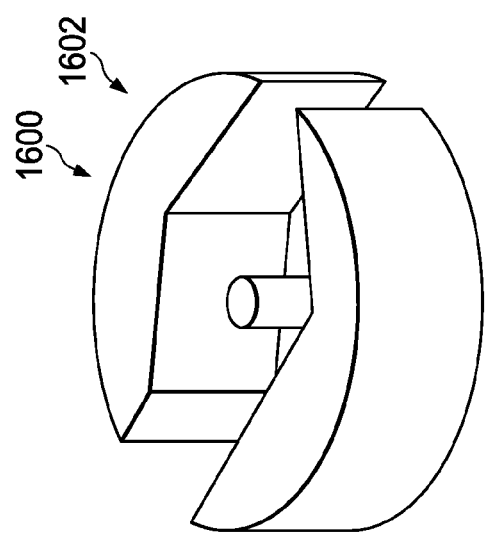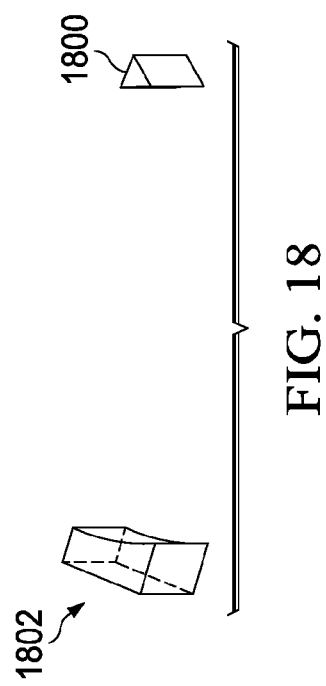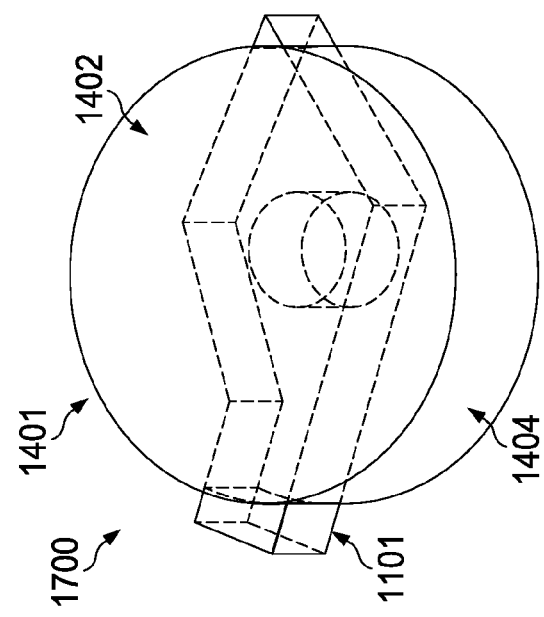

FIG. 24
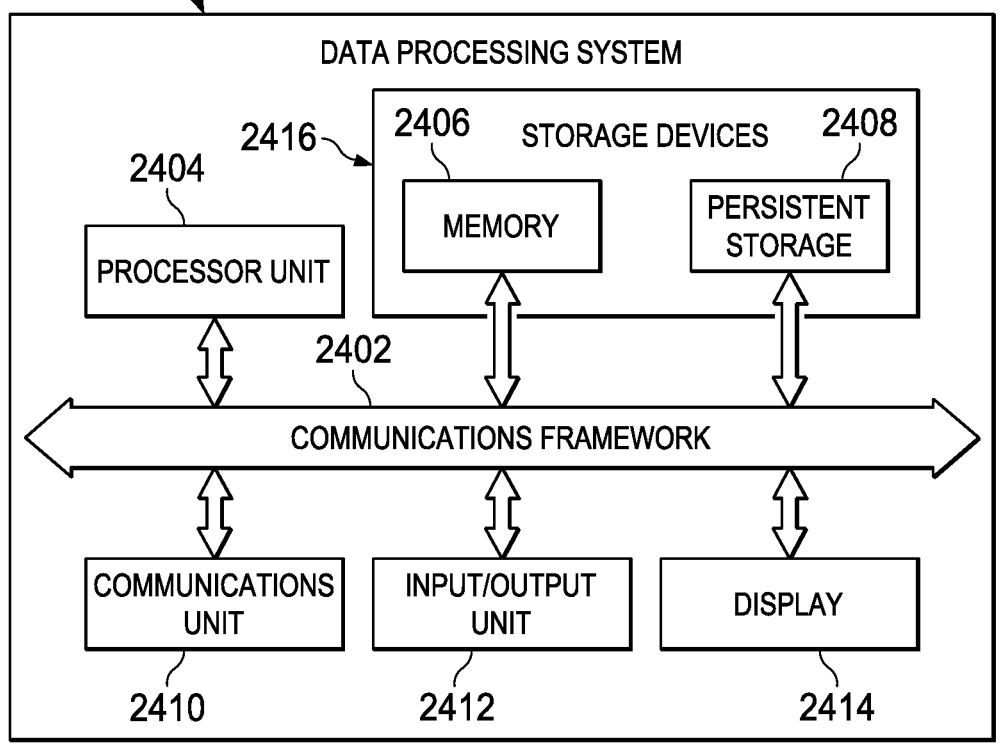
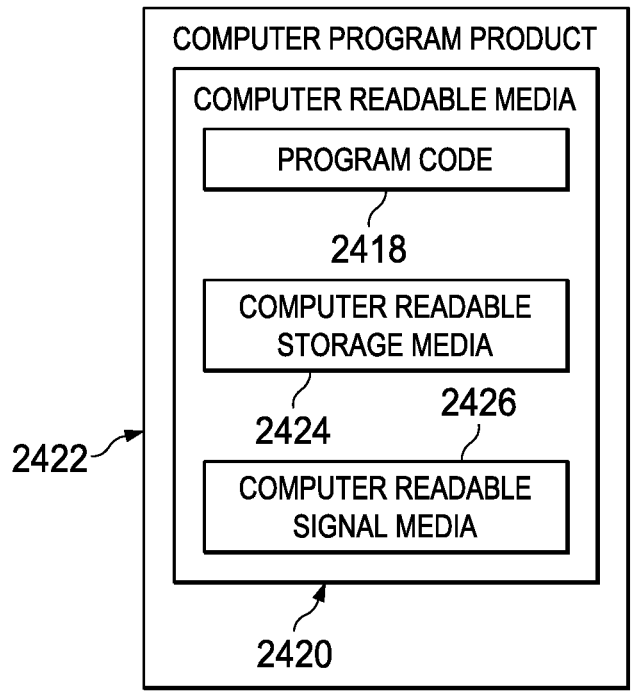

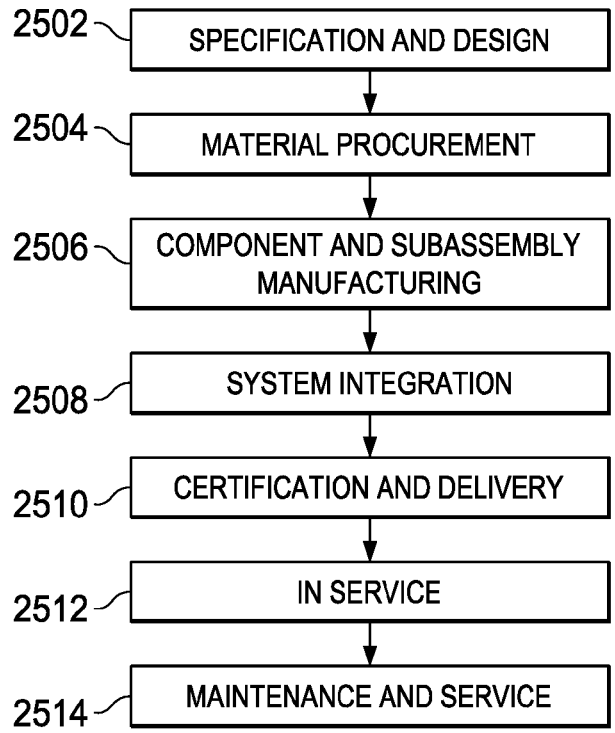
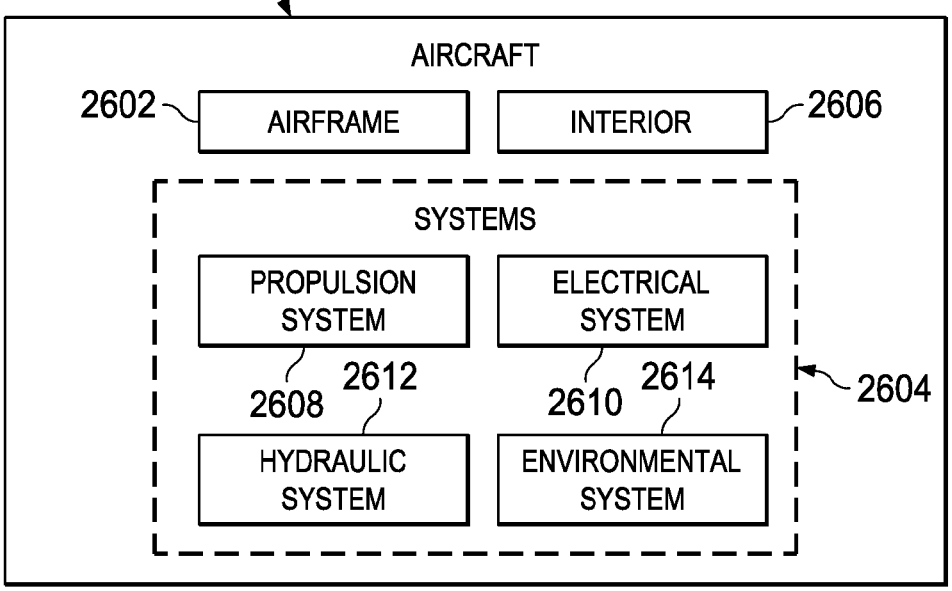

METHOD AND SYSTEM FOR MANAGING AIRCRAFT PARTS

BACKGROUND INFORMATION

1. Field

The present disclosure relates generally to manufacturing and, in particular, to manufacturing parts for vehicles. Still more particularly, the present disclosure relates to a method and system for designing aircraft parts for manufacturing.

2. Background

Manufacturing parts for an aircraft is a complex and time-consuming process. Hundreds of thousands of parts may be designed and assembled to complete an aircraft.

Manufacturing of aircraft parts includes designing each part to be assembled in the aircraft. These parts are often designed using computer-aided design (CAD) models of parts. Once a model is created, material selection and design modifications occur. The part is then analyzed, manufactured, and tested. This testing may include structural analysis, in-flight testing, ultrasound inspection, simulation, and various other types of testing. After testing of the part has occurred, the part may be certified such that each part meets Federal Aviation Administration (FAA) standards, internal manufacturing standards, or both.

In some cases, when designing new aircraft parts, designers may modify parts already in use. For example, a designer may use a part from an existing aircraft as a template to design a new part for another aircraft. As another example, a designer could revise the design of an existing part to add a feature, such as a mounting hole, or change the material properties used for the part.

To accomplish this task, the existing part would need to be located by the designer. Locating an existing part may be done in a variety of different ways. In one illustrative example, designers might possibly locate the existing part in a part database by entering the name of the existing part, the part number, or other information they remember about the part. As another example, the designer might visually search for a suitable part from a large inventory of parts in a warehouse or storage facility. In yet another illustrative example, designers who have previously worked on a similar part might possibly remember where to find the existing part for use.

Often, locating existing parts in this manner takes more time than desired. For example, if the designer does not have the correct file name or part number, searching for the existing part is difficult. Moreover, physically inspecting parts in a warehouse may take more time than designing a new part.

Even if a search is conducted for an existing part, in some cases, the designer may not be able to locate an existing part for use in a new design. When an existing part cannot be located by a search, substantial costs are incurred due to the time required to create, release, and maintain the data, contracts, and planning associated with the creation of new parts. Also, when a new part is designed, rather than reusing a previously certified design for part, the new part needs to be tested and certified for use in an aircraft.

In addition, low re-use of parts contributes to variability in manufacturing processes. As an example, equipment used to manufacture or assemble parts may need to be modified based on the specifications for the new part. This modification of manufacturing equipment is time-consuming and contributes to a loss of efficiency. As a result, the manufacturing and assembly of aircraft may take longer than desired. Therefore, it would be desirable to have a method and apparatus that take into account at least some of the issues discussed above, as well as other possible issues.

SUMMARY

In one illustrative embodiment, a system for selecting a part that most closely matches a desired part from a plurality of part models comprises a memory, a user interface, a processor unit, and product management software. The memory has a database including the plurality of part models for existing parts. The user interface is configured to receive input of a number of search parameters for the desired part. The product management software is executable by the processor unit and configured to retrieve part models from the database for the existing parts based on the number of search parameters. The processor unit is configured to define, for each of retrieved part models, a prism having a volume that contains the each of the retrieved part models, and display on a display system an assembly model including a three-dimensional view of candidate parts using the retrieved part models arranged in positions relative to each other. The candidate parts in the three-dimensional view are displayed in a side-by-side configuration in an order based on a number of characteristics of each prism such that a part model that most closely matches the desired part may be identified and selected for reuse.

In another illustrative embodiment, a method for managing a desired part is present. Part models for existing parts are retrieved from a database based on a number of search parameters for the desired part. For each part described by the retrieved part models, a prism having a volume that completely contains a volume of a part corresponding to the each of the retrieved part models is defined. An assembly model including a three-dimensional view of candidate parts using the retrieved part models arranged in positions relative to each other is displayed on a display system. The candidate parts in the three-dimensional view are displayed in a side-by-side configuration in an order based on a number of characteristics of each prism such that a part model that most closely matches the desired part may be identified. A part model is selected for the desired part from the three-dimensional view of the candidate parts using input from a user. The desired part is designed using the selected part model.

In yet another illustrative embodiment, a computer program product for managing a desired part comprises a computer-readable storage device, first program code, second program code, third program code, and fourth program code. The first program code is stored on the computer-readable storage device for retrieving part models based on a number of search parameters for the desired part. The second program code is stored on the computer-readable storage device for defining, for each retrieved part model, a prism having a volume that completely contains a volume of a part corresponding to the each of the retrieved part models. The third program code is stored on the computer-readable storage device, for displaying, on a display device, an assembly model including a three-dimensional view of candidate parts using the retrieved part models arranged in positions relative to each other. The candidate parts in the three-dimensional view are displayed in a side-by-side configuration in an order based on a number of characteristics of each prism such that a part model that most closely matches the desired part may be identified. The fourth program code is stored on the computer-readable storage device for selecting the part model for the desired part from the three-dimensional view of the candidate parts using input from a user. The desired part is designed using the selected part model.

In yet another illustrative embodiment, a manufacturing system comprises a product lifecycle management tool configured to retrieve part models from a database based on a number of search parameters. The product lifecycle management tool is further configured to define, for each of the retrieved part models, a prism having a volume that contains a volume of a part corresponding to the each of the retrieved part models. The product lifecycle management tool is further configured to display on a display system an assembly model including a three-dimensional view of candidate parts using the retrieved part models arranged in positions relative to each other. The candidate parts in the three-dimensional view are displayed in a side-by-side configuration in an order based on a number of characteristics of each prism such that a part model that most closely matches the desired part may be identified and selected for reuse.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 12 is an illustration of a graphical user interface in accordance with an illustrative embodiment;

FIG. 16 is an illustration of a three-dimensional view of resultant geometry from a shape comparison in accordance with an illustrative embodiment;

FIG. 17 is an illustration of a three-dimensional view of a candidate part and a desired part in accordance with an illustrative embodiment;

FIG. 18 is an illustration of a three-dimensional view of resultant geometry from a shape comparison in accordance with an illustrative embodiment;

FIG. 24 is an illustration of a data processing system in the form of a block diagram in accordance with an illustrative embodiment;

FIG. 25 is an illustration of a block diagram of an aircraft manufacturing and service method in accordance with an illustrative embodiment;

FIG. 26 is an illustration of a block diagram of an aircraft in which an illustrative embodiment may be implemented.

DETAILED DESCRIPTION

Figure 1:
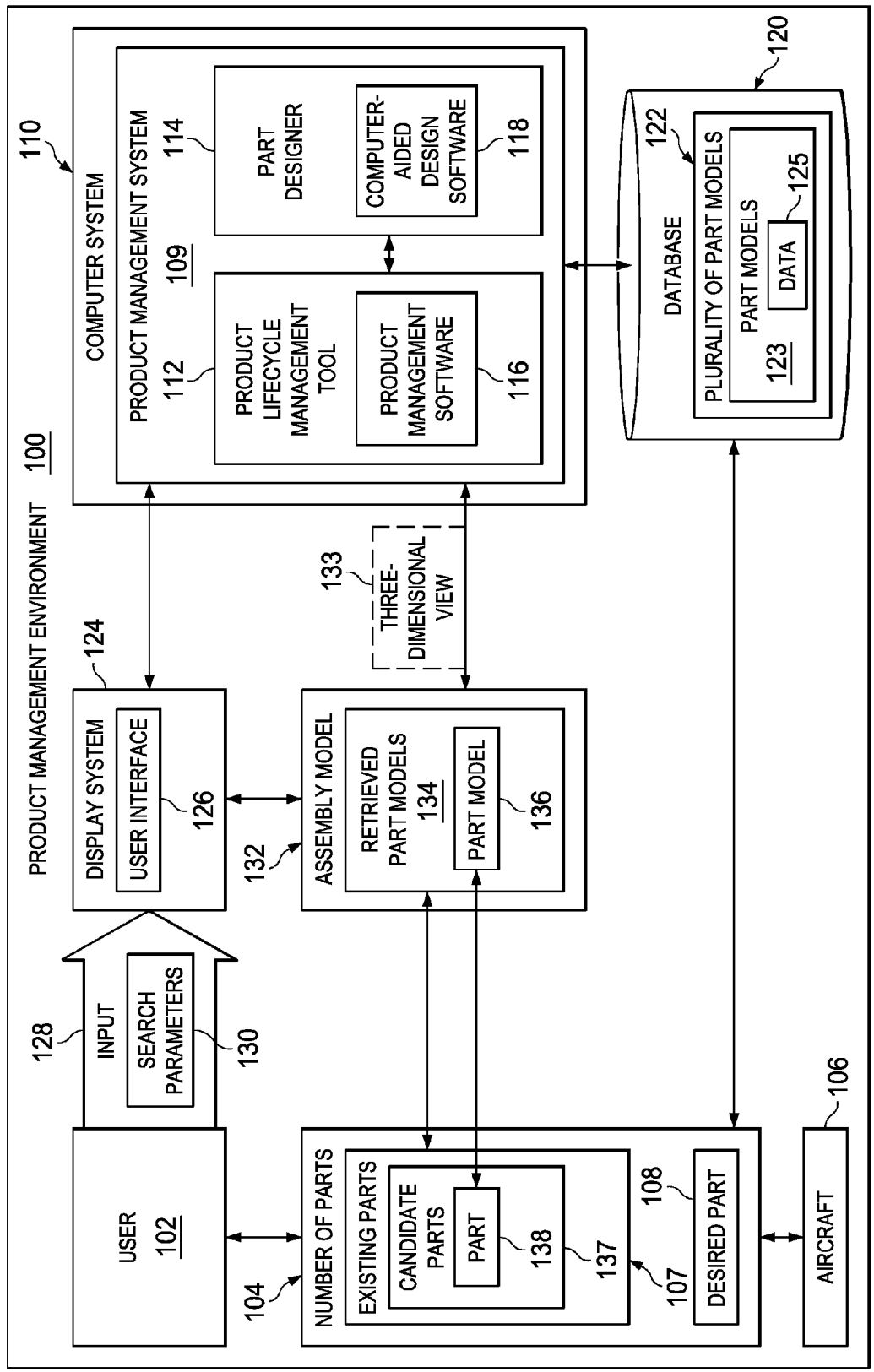
FIG. 1 is an illustration of a product management environment in the form of a block diagram in accordance with and illustrative embodiment.

The illustrative embodiments recognize and take into account one or more different considerations. For example, the illustrative embodiments recognize and take into account that it may be desirable to reuse existing parts to design new parts for aircraft. New parts may be designed using part models of existing parts. In other words, a part model for an existing part may be used for a new part being designed for an aircraft. The part model may be used to design the model for the new part without changes, or may be used as a basis in which modifications may be made.

The illustrative embodiments recognize and take into account, however, that locating existing part models that closely align with a desired part may be more difficult and time-consuming than desired. For instance, a part designer may search through hundreds of part models before the part designer finds a part model that has desired parameters for a new part. These parameters may include, for example, at least one of shape, volume, or some other suitable parameters.

In some cases, the part designer may search for part models for a large inventory of existing parts that are stored in a warehouse. In this case, the part designer obtains the part numbers for the existing physical parts from the parts in the warehouse and subsequently finds the corresponding part models in the database based on these part numbers. This process is time-intensive for the part designer. Consequently, the increased time may result in a product that takes longer than desired to develop, is more expensive than desired, or both.

The illustrative embodiments also recognize and take into account that, in other examples, the part designer may search for part models for existing parts by entering search parameters in a database. The search results based on search parameters from the database may be listed, opened individually, and examined to determine if the part model of the existing part is a match for the new part. This process may take more time than desired and may not provide all needed information to the part designer. The illustrative embodiments further recognize and take into account that if a part model of an existing part cannot be located, the designing, testing, certifying, and implementing of the new part may be more costly and time-consuming than desired.

Thus, the illustrative embodiments provide a method and system for managing a desired part. Part models for existing parts are retrieved from a database based on a number of search parameters for the desired part. A prism having a volume that completely contains a volume of a part corresponding to the each of the retrieved part models is defined. Different part models may have prims of different volumes. An assembly model including a three-dimensional view of parts using the retrieved part models arranged in positions relative or adjacent to each other is displayed on the display system. The parts in the three-dimensional view are displayed in a side-by-side configuration in an order based on a number of characteristics of each prism such that a part model that most closely matches the desired part may be identified. A part model for the desired part is selected from the three-dimensional view of the parts using input from a user. The desired part is designed using the selected part model.

Referring now to the figures and, in particular, with reference to FIG. 1, an illustration of a product management environment in the form of a block diagram is depicted in accordance with an illustrative embodiment. In product management environment 100, user 102 manages number of parts 104. In this illustrative example, user 102 is a person or system that interacts with components within product management environment 100.

As used herein, a "number of" items is one or more items. For example, number of parts 104 is one or more parts. In some illustrative examples, number of parts 104 may represent a number of physical parts. In this illustrative example, a "physical part" refers to a tangible structure. In other words, a physical part has been manufactured and may have been certified and tested. In other illustrative examples, the physical part may be, for example, a test part or a prototype part that may not have been certified or finalized for use. In other illustrative examples, number of parts 104 may be prototypes or conceptual parts, depending on the particular implementation.

A part in number of parts 104 is used for a product in product management environment 100. For instance, number of parts 104 are parts for a product selected from at least one of an aircraft, a ground vehicle, a spacecraft, a vehicle, a train, a truck, a building, a bridge, an engine, a computer, an electronic device, or some other suitable product.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

In this illustrative example, number of parts 104 are parts for aircraft 106. For example, without limitation, number of parts 104 may be selected from at least one or more of flanges, composite parts, spars, winglets, bladders, skin panels, rudders, lavatories, fasteners, and other suitable types of physical parts for aircraft 106.

As illustrated, number of parts 104 may include existing parts 107 and desired part 108. In some cases, existing parts 107 may be physical parts that have been manufactured, tested, certified, and implemented in aircraft 106. In other examples, existing parts 107 may have been manufactured but not yet implemented in aircraft 106.

In this depicted example, desired part 108 is a new or re-designed part for aircraft 106. Desired part 108 may not have been designed, manufactured, tested, or certified in this illustrative example. For instance, desired part 108 may be a new part that user 102 is designing.

In this illustrative example, product management environment 100 includes product management system 109. Product management system 109 comprises a number of tools configured to manage the production of number of parts 104. In this depicted example, number of parts 104 may be designed, created, fabricated, tested, certified, or managed in some other suitable manner by product management system 109.

As illustrated, product management system 109 may be implemented in computer system 110. Computer system 110 is one or more computers. When more than one computer is present in computer system 110, those computers are in communication with each other over a communications medium such as a network.

As depicted, product management system 109 includes product lifecycle management tool 112 and part designer 114. Product lifecycle management tool 112 is a component that monitors the various stages of production for aircraft 106 and each of number of parts 104. For instance, product lifecycle management tool 112 may perform different functions during the lifecycle of a product. The lifecycle may include, for example, at least one of design, testing, certification, use, maintenance, or other phases in the lifecycle of a product. For example, product lifecycle management tool 112 be used in at least one of designing, manufacturing, testing, certifying, or distributing of number of parts 104 for aircraft 106.

Product lifecycle management tool 112 also may generate information about the properties of number of parts 104 through their useful life in aircraft 106. These properties may include structural integrity, materials, usage, and other suitable properties. For instance, in response to a request by user 102, product lifecycle management tool 112 is used to generate information about aircraft 106 with number of parts 104.

Product lifecycle management tool 112 is configured to perform a number of processes for number of parts 104. For example, without limitation, product lifecycle management tool 112 manages descriptions, properties, specifications, development, and performs other suitable actions for each of number of parts 104.

In this illustrative example, product lifecycle management tool 112 may be implemented in software, hardware, firmware, or a combination thereof. When software is used, the operations performed by product lifecycle management tool 112 may be implemented using, for example, without limitation, program code configured to run on a processor unit. When firmware is used, the operations performed by product lifecycle management tool 112 may be implemented using, for example, without limitation, program code and data and stored in persistent memory to run on a processor unit.

When hardware is employed, the hardware may include one or more circuits that operate to perform the operations performed by product lifecycle management tool 112. Depending on the implementation, the hardware may take the form of a circuit system, an integrated circuit, an application specific integrated circuit (ASIC), a programmable logic device, or some other suitable type of hardware device configured to perform any number of operations.

A programmable logic device may be configured to perform certain operations. The device may be permanently configured to perform these operations or may be reconfigurable. A programmable logic device may take the form of, for example, without limitation, a programmable logic array, a programmable array logic, a field programmable logic array, a field programmable gate array, or some other type of programmable hardware device.

In some illustrative examples, the processes performed by product lifecycle management tool 112 may be performed using organic components integrated with inorganic components. These process are comprised of a number of operations. In some cases, the processes may be performed by entirely organic components, excluding a human being. As one illustrative example, circuits in organic semiconductors may be used.

In some illustrative examples, product lifecycle management tool 112 provides a framework for collaboration between user 102 and other users in product management environment 100. In this instance, product lifecycle management tool 112 may be an online platform.

In this depicted example, product lifecycle management tool 112 is implemented using product management software 116. Product management software 116 includes program code configured to run on a processor unit.

Product management software 116 may take a number of different forms. For example, without limitation, product management software 116 may be selected from ENOVIA® (Dassault Systemes), Product Data Manager (PDM), or other suitable types of product management software.

In this illustrative example, part designer 114 may also be implemented in hardware, software, or firmware, or a combination thereof, as described above. In this depicted example, part designer 114 is configured to assist user 102 in designing number of parts 104. For example, part designer 114 may be used to perform at least one of creation, modification, analysis, or optimization of number of parts 104.

In this depicted example, part designer 114 includes computer-aided design (CAD) software 118. Computer-aided design software 118 may take a number of different forms. For example, computer-aided design software 118 may be selected from AutoCAD®) (Autodesk), CATIA® (Dessault Systemes), SolidWorks® (Dessault Systemes SolidWorks Corp.), NX® Unigraphics (Siemens), Sketchup® (Google), or other suitable computer-aided design software.

As illustrated, product management environment 100 also includes database 120. Database 120 is a storage device in this illustrative example. Database 120 is located in a remote location from other components in product management environment 100 in this illustrative example. In other illustrative examples, database 120 may be part of product management system 109, computer system 110, or both.

Database 120 includes plurality of part models 122 for existing parts 107. In some illustrative examples, existing parts 107 are physical parts that have been designed and are described in plurality of part models 122. In other examples, existing parts 107 are parts described by plurality of part models 122 that may be in other stages of design, development, manufacturing, or a combination thereof. Each of plurality of part models 122 is a three-dimensional part model for one of existing parts 107.

In this illustrative example, each of plurality of part models 122 includes data 125 about one of existing parts 107. In this illustrative example, data 125 includes descriptions of visible and hidden surfaces of each of existing parts 107. Data 125 also includes other aspects of each of existing parts 107 including, for example, without limitation, general physical characteristics of each part and specifications of each part.

The general physical characteristics include at least one of dimensions, materials used, results of testing and structural analysis, weight, or other physical characteristics. The specifications include structural standards and other specifications for each of existing parts 107. Database 120 with plurality of part models 122 may be accessed to retrieve part models 123 in this illustrative example. Part models 123 is a group of part models in plurality of part models 122 stored in database 120 in this illustrative example.

In this depicted example, display system 124 may include a number of display devices. Display system 124 may take various forms. For example, the number of display devices in display system 124 may be selected from at least one of a computer screen, a tablet, a mobile phone, a touch screen device, or some other suitable type of display system.

As depicted, display system 124 includes user interface 126. User interface 126 is displayed by display system 124 and facilitates interaction with user 102. User 102 may enter input 128 into user interface 126 using one or more input devices selected from one of a keyboard, a mouse, a joystick, a microphone, a tablet, a touch screen, or other suitable types of input devices.

In this illustrative example, user 102 uses product management system 109 to create desired part 108. User 102 may want to create desired part 108 for use in aircraft 106. However, user 102 may first want to determine whether one of existing parts 107 may be a match for desired part 108.

In this depicted example, user 102 employs product management system 109 to search for a part in existing parts 107 that may match desired part 108. If one of plurality of part models 122 for one of existing parts 107 can be used as a template for the design of desired part 108, user 102 may save time and reduce cost of manufacturing desired part 108.

As used herein, a "template" is a copy of a part model used as a basis for creating a new part model for a new part. For example, one of plurality of part models 122 may be copied by part designer 114 to use the copy as a basis for designing desired part 108. This copy may be altered in part designer 114 based on desired features for desired part 108. In particular, this copy is altered by user 102 using computer-aided design software 118.

As illustrated, user 102 employs user interface 126 to enter input 128 for desired part 108. In this illustrative example, input 128 may include information about desired part 108. In this illustrative example, input 128 includes search parameters 130 corresponding to parameters for desired part 108.

As depicted, search parameters 130 are desired characteristics for desired part 108. In this illustrative example, search parameters 130 comprise at least one of a volume, a material, dimensions, a part type, a part number, or other suitable search parameters for desired part 108. Search parameters 130 correspond to data 125 stored in plurality of part models 122 for existing parts 107 in database 120.

In this depicted example, user interface 126 receives input 128 of a number of search parameters 130. Product management software 116 is configured to retrieve part models 123 from database 120 based on search parameters 130. Product management software 116 then displays assembly model 132 on display system 124.

In this illustrative example, assembly model 132 is used by product management system 109 to generate three-dimensional view 133 of candidate parts 137. A "candidate part" refers to a part in existing parts 107 that matches one or more of search parameters 130 for desired part 108. Retrieved part models 134 corresponding to candidate parts 137 may be used as a template, or baseline data set, for creation of desired part 108. For example, product management system 109 uses surfaces described in retrieved part models 134 to generate a three-dimensional view of each of candidate parts 137 in three-dimensional view 133. As illustrated, retrieved part models 134 represent part models 123 in plurality of part models 122 that correspond to search parameters 130 for desired part 108.

As depicted, three-dimensional view 133 are views of candidate parts 137 displayed using retrieved part models 134. In particular, a three-dimensional view of a part is a display of a part on a display system made using the part model that corresponds to the part. The part model is used to render the part on a display screen to generate the three-dimensional view of the part in the illustrative examples. The three-dimensional view of a part may take the form of images rendered using a part model and then displayed on a display system.

As depicted, product management system 109 presents assembly model 132 in user interface 126 by displaying three-dimensional view 133 of retrieved part models 134 of candidate parts 137 on display system 124. In this manner, user 102 may view three-dimensional view 133 of retrieved part models 134 of candidate parts 137 displayed in assembly model 132. From three-dimensional view 133 of retrieved part models 134 of candidate parts 137 shown in assembly model 132, user 102 may easily identify one or more of candidate parts 137 and its corresponding part model for designing desired part 108. In other words, three-dimensional view 133 of candidate parts 137 is displayed to user 102 as if user 102 could examine candidate parts 137 in person.

As illustrated, retrieved part models 134 include part model 136. Accordingly, one of candidate parts 137 displayed in assembly model 132 corresponds to select part model 136. In this illustrative example, select part model 136 in retrieved part models 134 corresponds to part 138 in existing parts 107 that most closely matches desired part 108. User 102 may select part model 136 to use as a template for desired part 108. Desired part 108 may then be designed and manufactured using part model 136.

With the use of product management system 109, desired part 108 may be designed and manufactured more quickly and easily than with some currently used systems. For example, a part model may already exist for part 138 substantially similar to desired part 108. User 102 can use this part model to manufacture desired part 108. In this case, product management system 109 with product management software 116 decreases the unnecessary duplication of parts for aircraft 106.

In another example, selected part model 136 may not match the desired part exactly, or within selected tolerances, and therefore, user 102 modifies part model 136. When a part model for one of existing parts 107 is modified to design desired part 108, savings in time and expense may still be realized, even though desired part 108 still requires testing and certification. Savings occur in identifying suppliers, manufacturing processes, and equipment used to produce desired part 108.

In still other examples, selected part model 136 may not correspond to one of existing parts 107 that has been manufactured, tested, certified, or a combination thereof. However, material selection or other important features about the existing part already may have been determined, saving time for user 102. In still other illustrative examples, finding that one of existing parts 107 closely matches desired part 108 may lead to collaboration with the designers of the matching part. In this manner, the time needed to design desired part 108 and the cost for manufacturing desired part 108 may be reduced.

Figure 2:
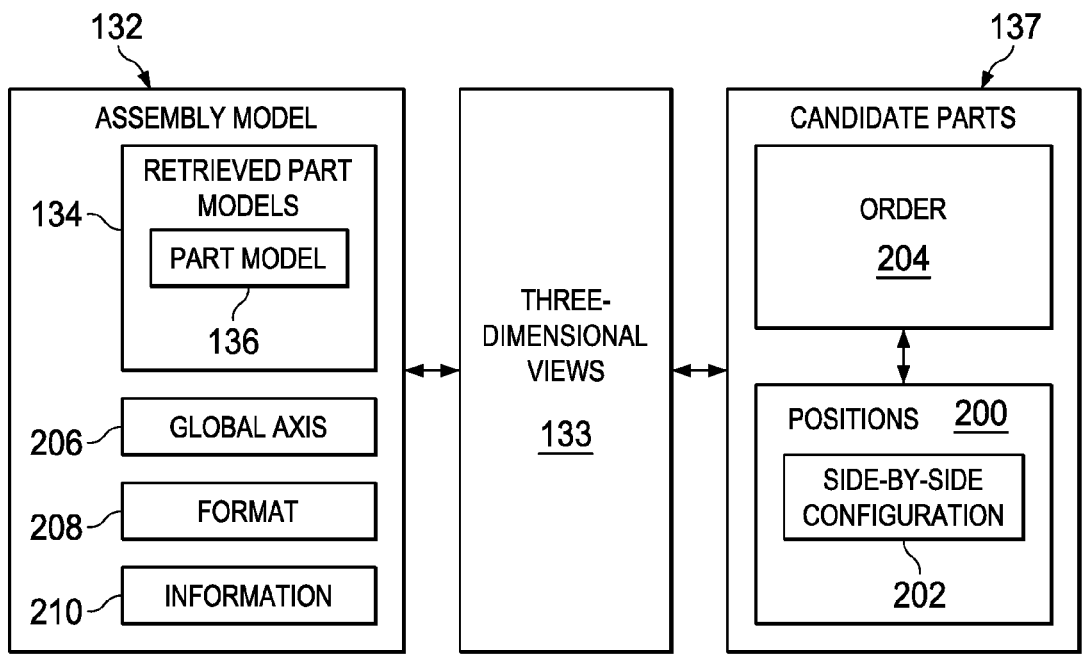
FIG. 2 is an illustration of an assembly model in the form of a block diagram in accordance with an illustrative embodiment.

Turning next to FIG. 2, an illustration of an assembly model is depicted in the form of a block diagram in accordance with an illustrative embodiment. In this depicted example, examples of components within assembly model 132 from FIG. 1 are shown.

As illustrated, assembly model 132 includes three-dimensional view 133 of candidate parts 137 using retrieved part models 134 arranged in positions 200 relative or adjacent to each other. Positions 200 are physical locations for each of candidate parts 137 loaded in assembly model 132.

In this illustrative example, candidate parts 137 in three-dimensional view 133 are arranged in side-by-side configuration 202. Side-by-side configuration 202 is an arrangement of candidate parts 137 in three-dimensional view 133 in which each of candidate parts 137 is positioned next to each other.

As depicted, candidate parts 137 in side-by-side configuration 202 in three-dimensional view 133 are arranged in order 204. Order 204 may reflect candidate parts 137 corresponding to retrieved part models 134 that most closely match search parameters 130 for desired part 108 from FIG. 1. For instance, the best match for desired part 108 may be the first one of candidate parts 137 displayed in assembly model 132 in three-dimensional view 133. Accordingly, the remainder of candidate parts 137 in three-dimensional view 133 are arranged in side-by-side configuration 202 based on how well those parts match desired parameters of the desired part 108. In other illustrative examples, order 204 may be based on other considerations, depending on the particular implementation.

In one example, order 204 is based on availability of materials for candidate parts 137. In another example, order 204 is based on volume match. In other words, the one of candidate parts 137 that is the closest match to a desired volume for desired part 108 is displayed first. In still another illustrative example, order 204 is based on the supplier or availability of the candidate part.

In this depicted example, assembly model 132 includes global axis 206. Global axis 206 is a reference line extending along assembly model 132 on which candidate parts 137 in three-dimensional view 133 may be arranged. In other words, three-dimensional view 133 of candidate parts 137 using retrieved part models 134 are arranged in side-by-side configuration 202 in order 204 along global axis 206 of assembly model 132 to be displayed in display system 124 for user 102 in FIG. 1.

As illustrated, assembly model 132 has format 208. Format 208 is a visual layout for assembly model 132. For example, assembly model 132 is displayed in format 208 in display system 124 for user 102. Format 208 is selected from at least one of a virtual shelf, a virtual store, or a virtual warehouse.

In this illustrative example, a virtual shelf is a format in which candidate parts 137 in three-dimensional view 133 in assembly model 132 are displayed on one or more shelves for selection by user 102. A virtual store is a format for assembly model 132 in which a store is simulated and each of candidate parts 137 are displayed like products in a physical store.

In this depicted example, a virtual warehouse is a format for assembly model 132 in which candidate parts 137 are shown in three-dimensional view 133 as parts located in a warehouse. In both the virtual store and virtual warehouse format, product management software 116 in FIG. 1 may be configured to allow user 102, to "walk through" the virtual store or virtual warehouse to identify, analyze, and select part model 136 for use in designing desired part 108. In other words, user 102 will have a perspective view of each of candidate parts 137 described by retrieved part models 134 as if user 102 was visually inspecting the corresponding physical parts. When assembly model 132 is displayed in display system 124, information 210 about one or more candidate parts 137 corresponding to retrieved part models 134 also may be displayed.

In this depicted example, information 210 may be selected from at least one of a part number, a type of part, a file name, a material, a certification, a status of the part, manufacturing instructions, dimensions, or some other suitable type of information. Information 210 may be displayed in a window, tooltip, or using some other display mechanism. Information 210 aids in identifying a candidate part in candidate parts 137 and corresponding part model in retrieved part models 134 that is suitable for use in designing desired part 108.

Figure 3:
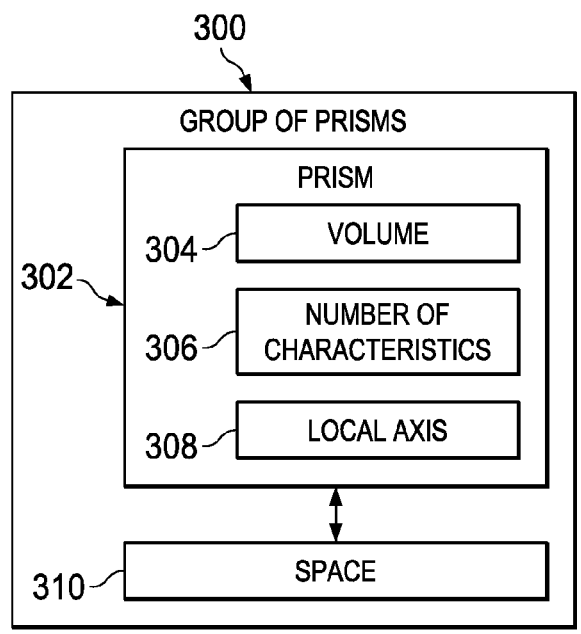
FIG. 3 is an illustration of a group of prisms corresponding to a group of part models in the form of a block diagram in accordance with an illustrative embodiment.

With reference next to FIG. 3, an illustration of a group of prisms corresponding to a group of part models is depicted in the form of a block diagram in accordance with an illustrative embodiment. In this depicted example, group of prisms 300 corresponding to retrieved part models 134 from FIG. 1 is shown.

As illustrated, one of group of prisms 300 corresponds to one of retrieved part models 134. In particular, group of prisms 300 corresponds to a part described by each one of retrieved part models 134. Product management software 116 from FIG. 1 is configured to define one of group of prisms 300 for each of retrieved part models 134.

In this illustrative example, group of prisms 300 includes prism 302. Prism 302 is a geometric shape that corresponds to part 138 described by part model 136 in FIG. 1 and FIG. 2 in this illustrative example. As depicted, prism 302 has volume 304. Volume 304 for prism 302 completely contains a volume of part 138 described by part model 136 in FIG. 1. For example, when part 138 is displayed in a three-dimensional view using part model 136, a volume for the three-dimensional view of part 138 fits within volume 304 of prism 302 such that no portion of the volume of part 138 is outside of prism 302. In other words, prism 302 contains the three-dimensional view of part 138 described by part model 136.

In this depicted example, prism 302 may take a number of different forms. For example, without limitation, prism 302 may be selected from one of a rectangular prism, a triangular prism, a hexagonal prism, a cube, a spherical polyhedron, and other suitable types of prisms.

In this illustrative example, prism 302 has number of characteristics 306. Number of characteristics 306 are attributes for prism 302. Number of characteristics 306 may be selected from at least one of volume 304, a diameter, a length, an area of a side, or other suitable characteristics for prism 302.

As illustrated, product management software 116 generates three-dimensional view 133 of candidate parts 137 using retrieved part models 134. Product management software 116 then displays three-dimensional view 133 of candidate parts 137 in side-by-side configuration 202 in order 204 based on number of characteristics 306 of each of group of prisms 300. For example, volume 304 of prism 302 for part model 136 may be used by product management software 116 to display a three-dimensional view of part 138 relative to other three-dimensional views of other candidate parts 137 in assembly model 132 in FIG. 1 and FIG. 2 in a desired manner.

As depicted, prism 302 also includes local axis 308. Local axis 308 is a coordinate system for prism 302. Local axis 308 may include an x-axis, a y-axis, and a z-axis. In an illustrative example, the x-axis is positioned along the longest edge of prism 302, the y-axis is positioned along the second longest edge of prism 302, and the z-axis is positioned along the shortest edge of prism 302.

Product management software 116 identifies a local axis for each prism corresponding to a part in each of retrieved part models 134. The local axis of each prism corresponding to a part in each of retrieved part models 134 will be placed along global axis 206 of assembly model 132 to arrange candidate parts 137 using retrieved part models 134 relative to each other in three-dimensional view 133.

In an illustrative example, as each of candidate parts 137 described by retrieved part models 134 is populated into assembly model 132, the corresponding local axis of the prism is translated and rotated so as to reorient retrieved part models 134, such that the local axis aligns with global axis 206 in FIG. 2 of assembly model 132. For instance, the first and smallest one of candidate parts 137 described by one of retrieved part models 134 may be displayed in three-dimensional view 133 such that the local axis of its prism lies directly on top of global axis 206, with each subsequent candidate part being translated along the z-axis such that space 310 remains between the corresponding prism and the local axis of the prism.

As depicted, space 310 may be defined as a fixed value or may be defined by user 102. In still other illustrative examples, space 310 between prisms in group of prisms 300 may be defined as a percentage of the volume of each prism. Product management software 116 then iterates for each of retrieved part models 134 until three-dimensional view 133 of candidate parts 137 using retrieved part models 134 are populated into assembly model 132. In this manner, product management software 116 displays three-dimensional view 133 of candidate parts 137 in side-by-side configuration 202 in a desired manner.

Figure 4:
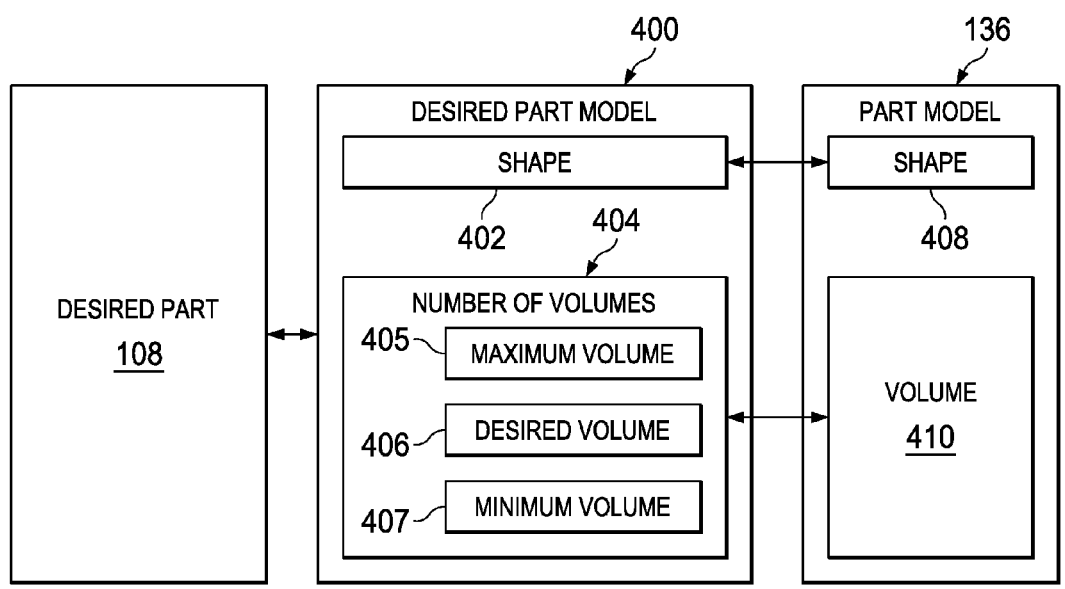
FIG. 4 is an illustration of a desired part and a part model in the form of a block diagram in accordance with an illustrative embodiment.

Referring now to FIG. 4, an illustration of a desired part and a desired part model is depicted in the form of a block diagram in accordance with an illustrative embodiment. In this depicted example, components associated with desired part 108 and part model 136 from FIG. 1 are shown.

In this illustrative example, desired part 108 is described by desired part model 400. Desired part model 400 may be a computer-aided design model including data for desired part 108. User 102 from FIG. 1 or some other suitable entity may have created desired part model 400.

As illustrated, desired part model 400 includes descriptions of visible and hidden surfaces of desired part 108. In particular, desired part model 400 includes shape 402 and number of volumes 404 for desired part 108. In this illustrative example, the number of volumes 404 are a range of volumes. In other illustrative examples, number of volumes 404 may include only a single volume.

Shape 402 represents the contours of desired part 108 described by desired part model 400. Shape 402 may include an orientation, properties, size, dimensions, or other features that comprise the geometrical configuration of desired part 108. In other words, shape 402 is a desired shape for desired part 108.

In this depicted example, number of volumes 404 includes maximum volume 405, desired volume 406, and minimum volume 407. Number of volumes 404 represents a range of acceptable volumes for desired part 108. Maximum volume 405, desired volume 406, minimum volume 407, or a combination thereof may be defined by user 102 or set by product management software 116 from FIG. 1.

Desired volume 406 is the amount of three-dimensional space occupied by desired part 108. Desired volume 406 may be a specified value in this illustrative example. Maximum volume 405 is the greatest amount of physical space that is desired for desired part 108, while minimum volume 407 is the smallest amount of physical space that is desired for desired part 108. In other words, maximum volume 405 and minimum volume 407 represent desired tolerances for the volume of desired part 108. In this illustrative example, number of volumes 404 may be used for one of search parameters 130 from FIG. 1 in retrieving part models 123 for use in designing desired part 108.

As illustrated, part model 136 corresponding to part 138 from FIG. 1 includes information about shape 408 and volume 410 of part 138. Shape 408 represents the contours of part 138 corresponding to part model 136 that encompasses volume 410. In this illustrative example, shape 408 may include an orientation, properties, size, dimensions, or other features that comprise the geometrical configuration of part 138. Volume 406 is the amount of three-dimensional space occupied by part 138 with shape 408.

As depicted, product management software 116 from FIG. 1 may identify at least one of shape 402 of desired part 108, number of volumes 404 for desired part 108, shape 408 of part 138, or volume 410 of part 138. Product management software 116 then uses these values to position a three-dimensional view of part 138 using part model 136 in assembly model 132 based on a match of volume, shape, or both volume and shape between part 138 and desired part 108.

The illustration of product management environment 100 and the components within product management environment 100 in FIGS. 1-4 is not meant to imply physical or architectural limitations to the manner in which an illustrative embodiment may be implemented. Other components in addition to or in place of the ones illustrated may be used. Some components may be optional.

Also, the blocks are presented to illustrate some functional components. One or more of these blocks may be combined, divided, or combined and divided into different blocks when implemented in an illustrative embodiment.

Figure 5:
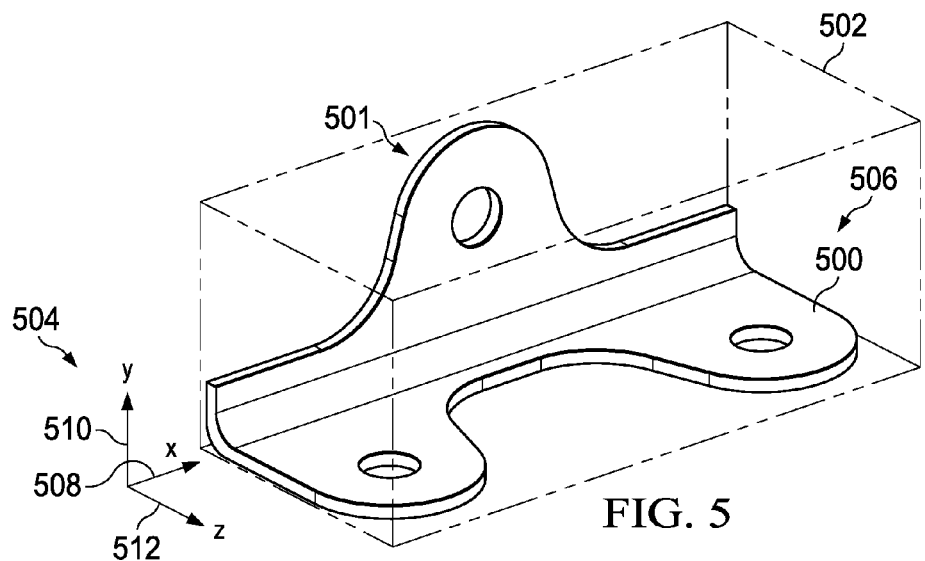
FIG. 5 is an illustration of a display of a three-dimensional view of a part and a prism in accordance with an illustrative embodiment.

Turning next to FIG. 5, an illustration of a display of a three-dimensional view of a part and a prism is depicted in accordance with an illustrative embodiment. In this depicted example, a display of three-dimensional view 500 of a part 501 using a part model is shown. Three-dimensional view 500 of part 501 is an example of an implementation for three-dimensional view 133 of one of candidate parts 137 shown in block form in FIG. 1.

As depicted, three-dimensional view 500 of part 501 is positioned within prism 502. Prism 502 is a rectangular prism in this illustrative example.

In this illustrative example, prism 502 has local axis 504 and volume 506. Local axis 504 includes x-axis 508 arranged along the longest edge of prism 502, y-axis 510 arranged along the second longest edge of prism 502, and z-axis 512 arranged along the shortest edge of prism 502. Local axis 504 is used to arrange three-dimensional view 500 of part 501 in prism 502 relative to other parts in an assembly model for viewing. Volume 506 for prism 502 is a volume that completely contains part 501.

Figure 6:
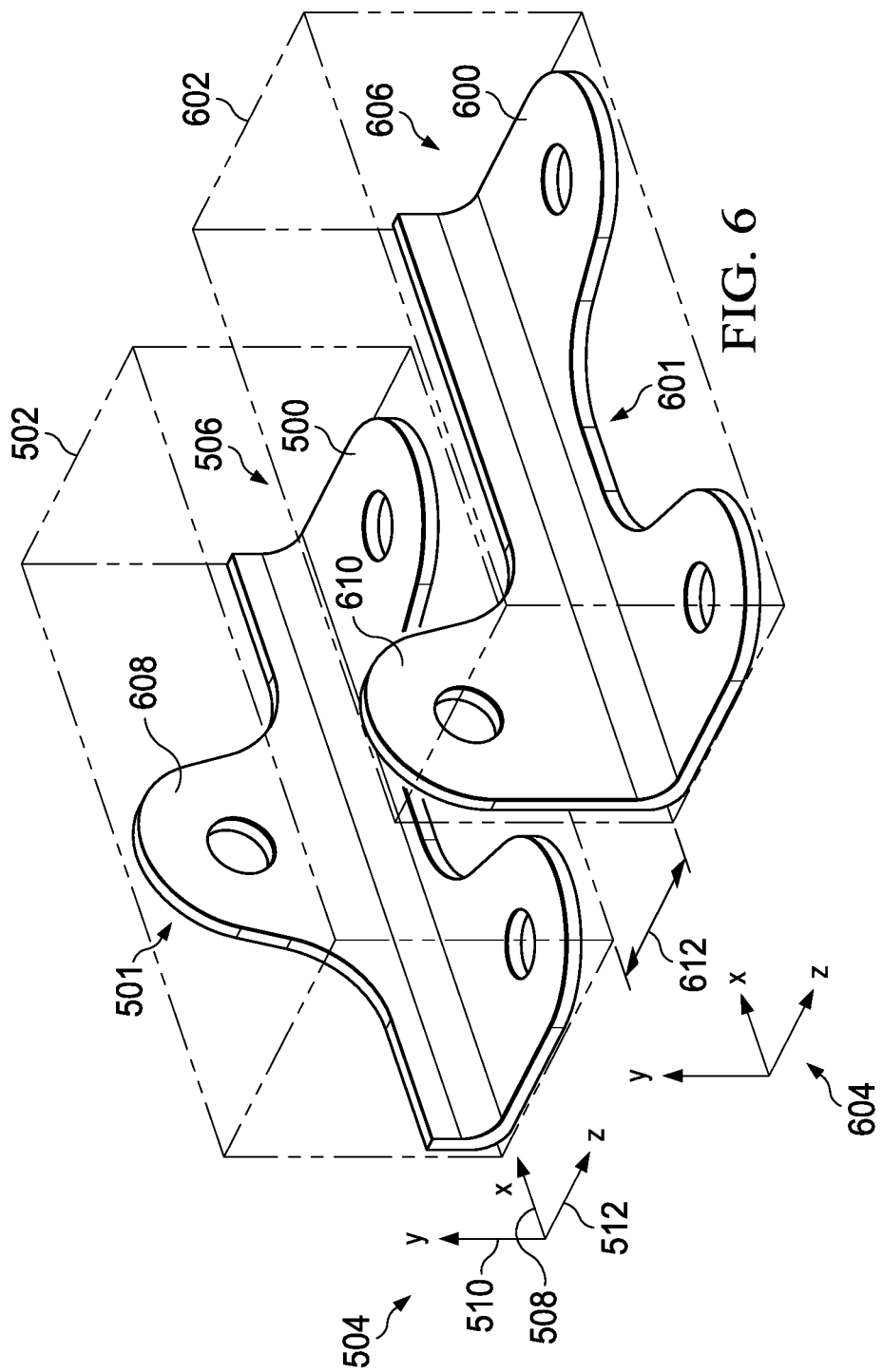
FIG. 6 is an illustration of a display of a three-dimensional view of parts with prisms in accordance with an illustrative embodiment.

Referring next to FIG. 6, an illustration of a display of a three-dimensional view of parts with prisms is depicted in accordance with an illustrative embodiment. In this depicted example, three-dimensional view 500 of part 501 from FIG. 5 is positioned relative to three-dimensional view 600 of part 601. Three-dimensional view 600 of part 601 is an example of an implementation of three-dimensional view 133 of one of candidate parts 137 shown in block form in FIG. 1. Three-dimensional view 500 of part 501 and three-dimensional view 600 of part 601 have been placed into an assembly by product management software 116 from FIG. 1.

Three-dimensional view 600 of part 601 is shown within prism 602. Prism 602 has local axis 604 and volume 606, as described above. Three-dimensional view 600 of part 601 and three-dimensional view 500 of part 501 are similar but not identical. For example, the position of flange 608 of three-dimensional view 500 of part 501 is different than the position of flange 610 of three-dimensional view 600 of part 601. Additionally, volume 506 of prism 502 may be the same or different than volume 606 of prism 602. However, both part 601 and part 501 may be candidates for use for a template for a desired part such as desired part 108 shown in block form in FIG. 1. Part 601 and part 501 correspond to existing parts that meet search parameters input by a user in this illustrative example.

In this depicted example, three-dimensional view 500 of part 501 and three-dimensional view 600 of part 601 are arranged relative to each other with space 612 in between them. Space 612 may be determined by the user or in some other manner, depending on the particular implementation.

Figure 7:
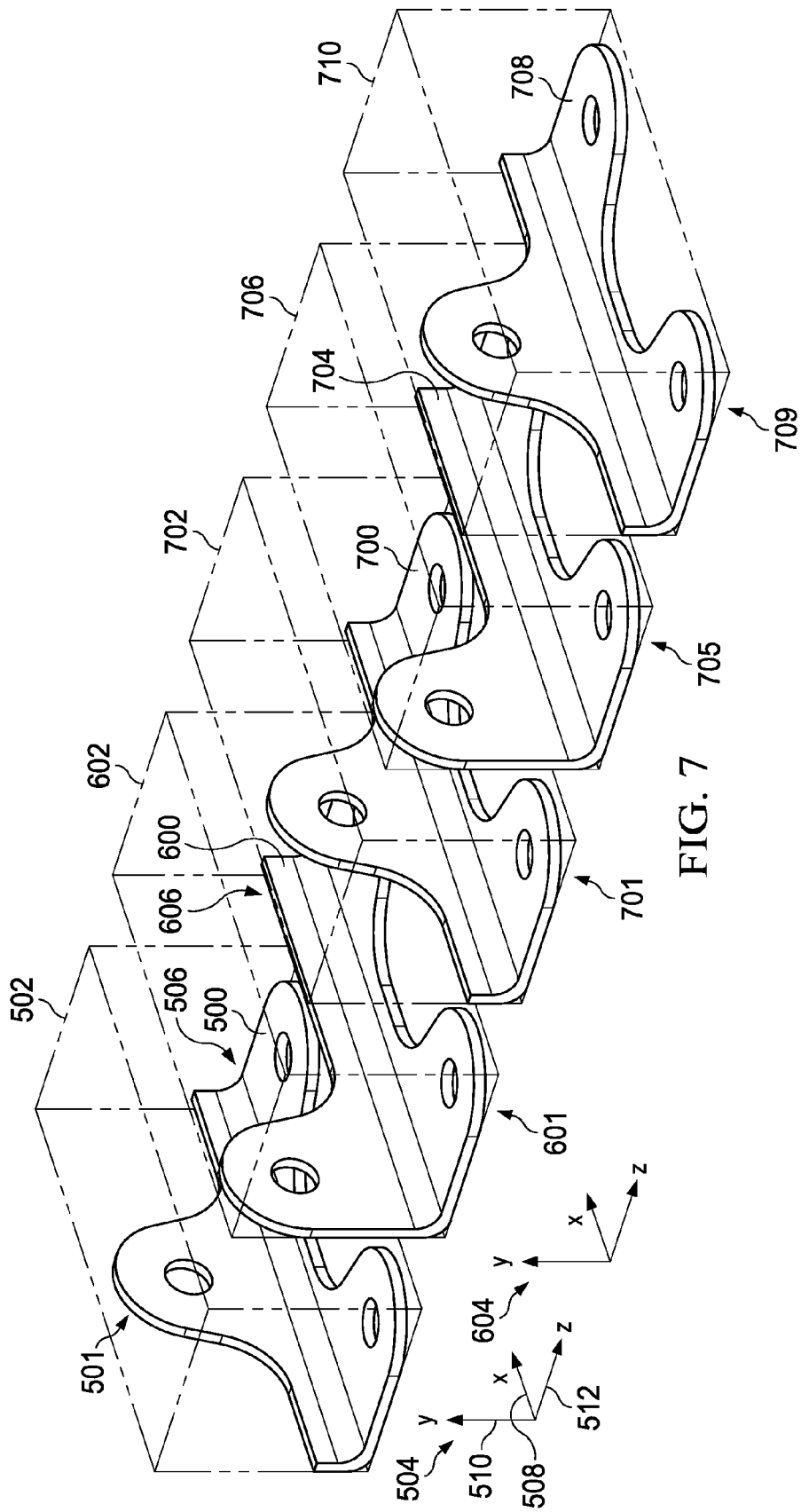
FIG. 7 is an illustration of a group of prisms and a three-dimensional view of parts in accordance with an illustrative embodiment.

In FIG. 7, an illustration of a group of prisms and a three-dimensional view of parts is depicted in accordance with an illustrative embodiment. In this depicted example, three-dimensional view 500 of part 501, three-dimensional view 600 of part 601, and a number of additional three-dimensional views of parts are shown populated in an assembly. In particular, three-dimensional view 700 of part 701 with prism 702, three-dimensional view 704 of part 705 with prism 706, and three-dimensional view 708 of part 709 with prism 710 are shown in a side-by-side configuration.

In this illustrative example, three-dimensional view 700, three-dimensional view 704, and three-dimensional view 708 are also examples of implementations for three-dimensional view 133 of one of candidate parts 137 shown in block form in FIG. 1. Three-dimensional view 500 of part 501, three-dimensional view 600 of part 601, three-dimensional view 700 of part 701, three-dimensional view 704 of part 705, and three-dimensional view 708 of part 709 are arranged relative or adjacent to one another with a space in between them. This space may be same distance as space 612 in FIG. 6.

Figure 8:
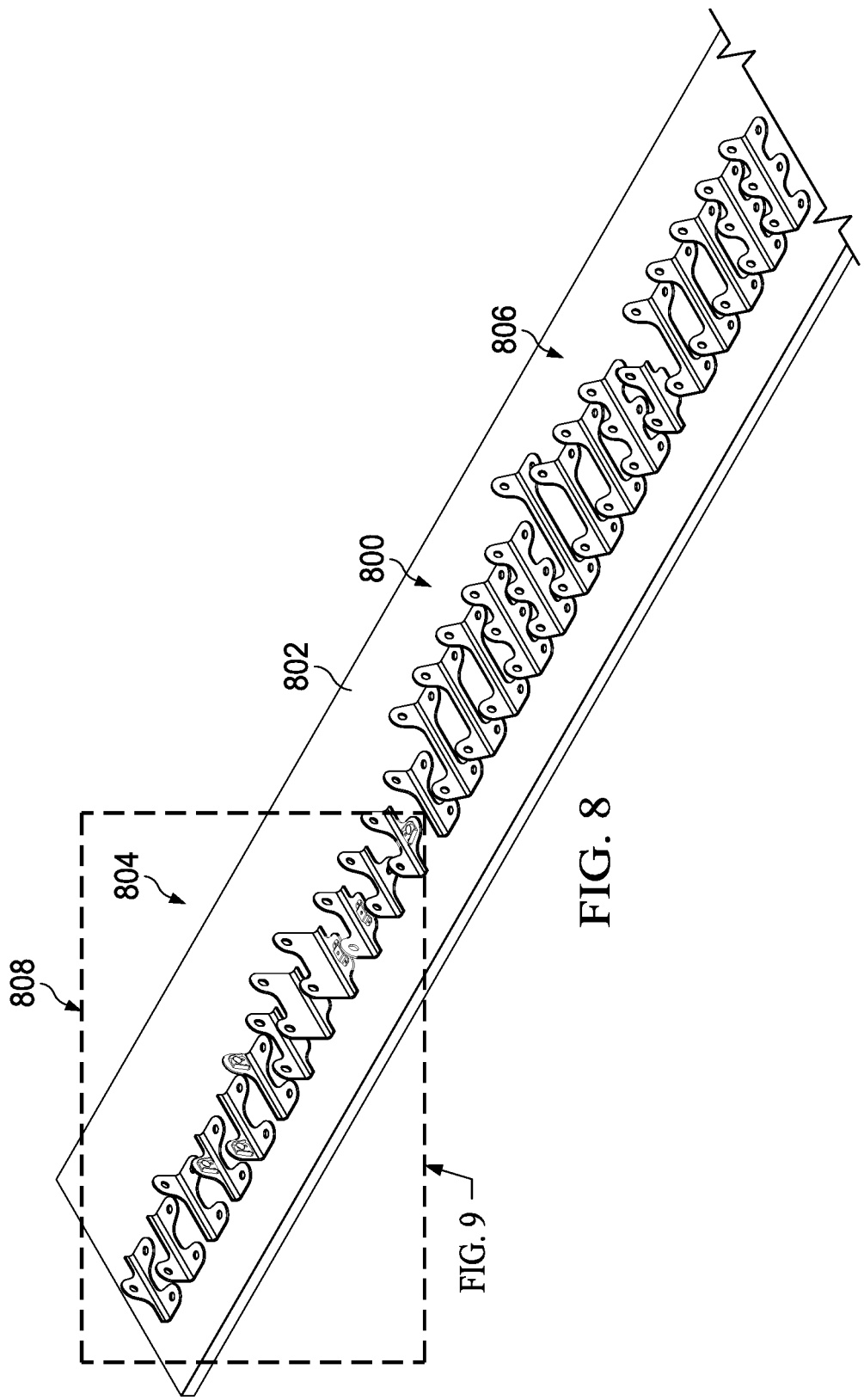
FIG. 8 is an illustration of a three-dimensional view of candidate parts from an assembly model in accordance with an illustrative embodiment.

With reference to FIG. 8, an illustration of a three-dimensional view of candidate parts from an assembly model is depicted in accordance with an illustrative embodiment. In this depicted example, three-dimensional view 800 of candidate parts 804 from an assembly model is an example of one implementation of three-dimensional view 133 of candidate parts 137 from assembly model 132 displayed on display system 124 shown in block form in FIG. 1. Three-dimensional view 800 of candidate parts 804 in the assembly model is shown on virtual shelf 802 in this illustrative example. The assembly model was generated based on search parameters input by a user.

As depicted, three-dimensional view 800 of candidate parts 804 are displayed in a side-by-side configuration 806 using the retrieved part models. In this depicted example, candidate parts 804 in three-dimensional view 800 may be arranged in an order corresponding to a match between the part model and a desired part. The most closely matched candidate part may be displayed first, with the least closely matched candidate part being displayed last. Section 808 of three-dimensional view 800 of candidate parts 804 is shown in greater detail with respect to FIG. 9. In this manner, a user may identify, analyze, and select a part model based on three-dimensional view 800 of one of candidate parts 804 that is suitable for use for the desired part.

Figure 9:
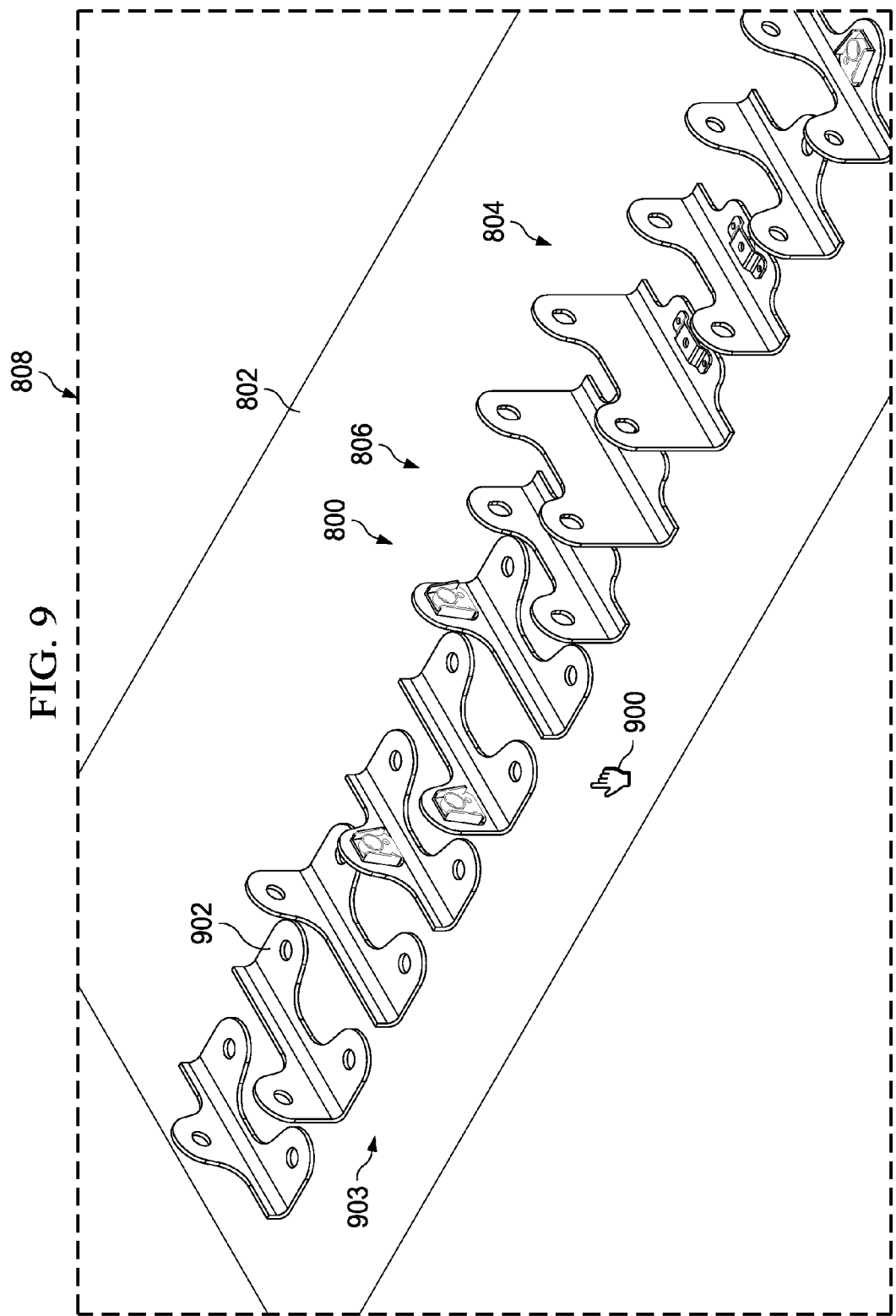
FIG. 9 is an illustration of a section of a three-dimensional view of candidate parts in an assembly model in accordance with an illustrative embodiment.

Turning next to FIG. 9, an illustration of a section of a three-dimensional view of candidate parts in an assembly model is depicted in accordance with an illustrative embodiment. In this depicted example, section 808 of three-dimensional view 800 of candidate parts 804 from FIG. 8 is shown.

As illustrated, cursor 900 is shown. Cursor 900 may be used to more closely analyze and select one of candidate parts 804 in three-dimensional view 800. For example, a user may wave cursor 900 over the three-dimensional view of one of candidate parts 804 to view more information about the corresponding part model, to select a part model, or to perform a number of additional operations.

In another illustrative example, a user may use cursor 900 to select candidate part 902 and change the orientation of three-dimensional view 903 of candidate part 902 to inspect it from various perspective views. For instance, the user may rotate three-dimensional view 903 of candidate part 902 about an axis, enlarge three-dimensional view 903 of candidate part 902, or perform some other suitable type of inspection of three-dimensional view 903 of candidate part 902. The user may select other candidate parts 804 in three-dimensional view 800 in a similar manner.

Figure 10:
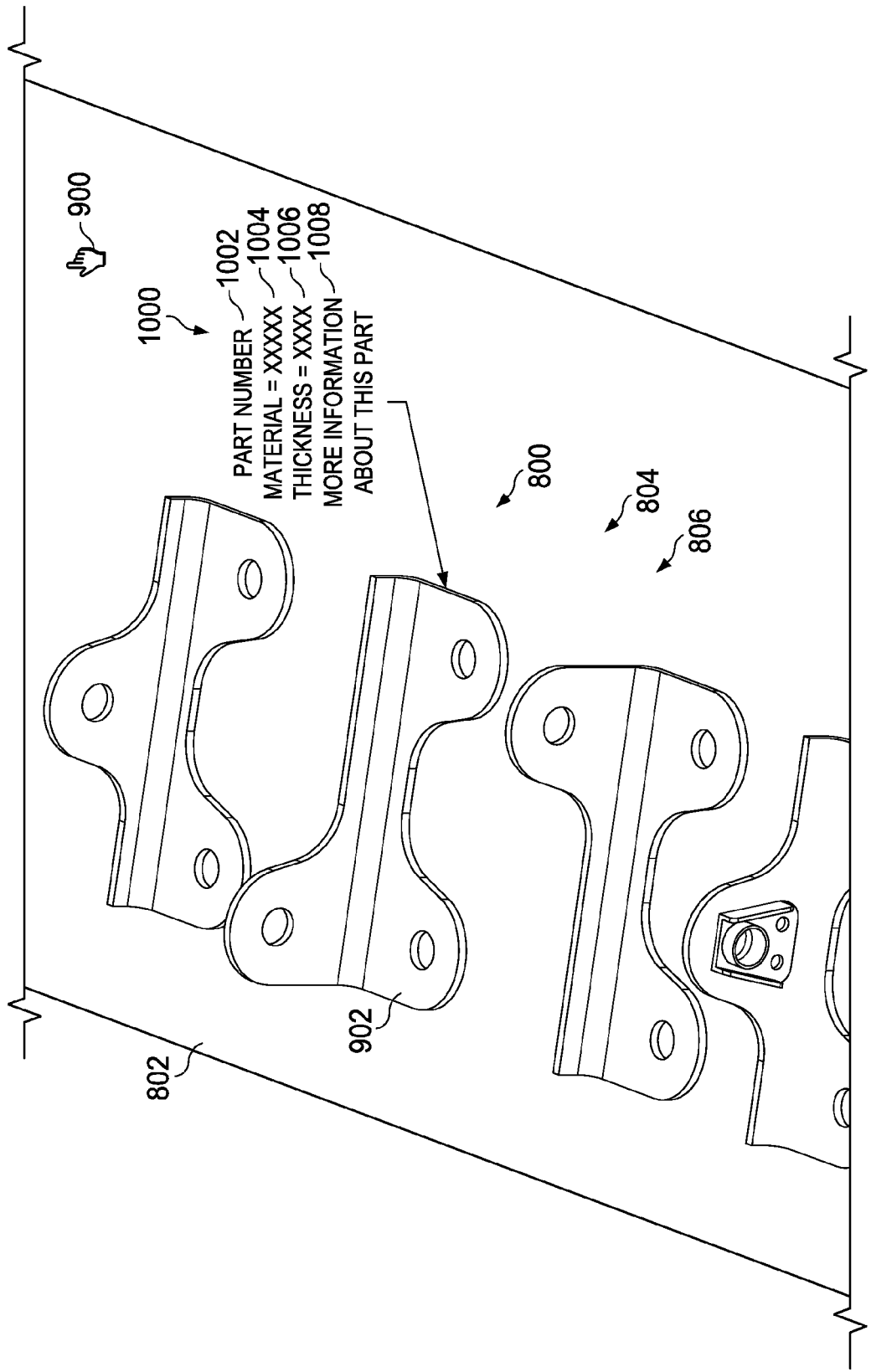
FIG. 10 is an illustration of a three-dimensional view of a part and information in accordance with an illustrative embodiment.

In FIG. 10, an illustration of a three-dimensional view of a part and information is depicted in accordance with an illustrative embodiment. In this illustrative example, three-dimensional view 903 of candidate part 902 from FIG. 9 is shown with information 1000.

As depicted, information 1000 includes part number 1002, material 1004, thickness 1006, and link 1008. Part number 1002 is an identifier for the physical part corresponding to candidate part 902. Part number 1002 allows a user to locate additional information about candidate part 902 in various databases and other components in product management system 109. Material 1004 is a material for the physical part. Thickness 1006 is the thickness of the physical part.

In this illustrative example, link 1008 provides additional information about candidate part 902 and its corresponding part model. Link 1008 may be a link to certification documents, test results, engineering notes, and other suitable information.

FIGS. 11-18 illustrate the process of retrieving part models based on a volumetric comparison of a desired part to existing part models. A "volumetric comparison" refers to a determination as to whether a volume of existing part models correspond to the volume of a part model for the desired part. The process described in FIGS. 11-18 may be implemented using product management software 116 in product management system 109 from FIG. 1.

Figure 11:
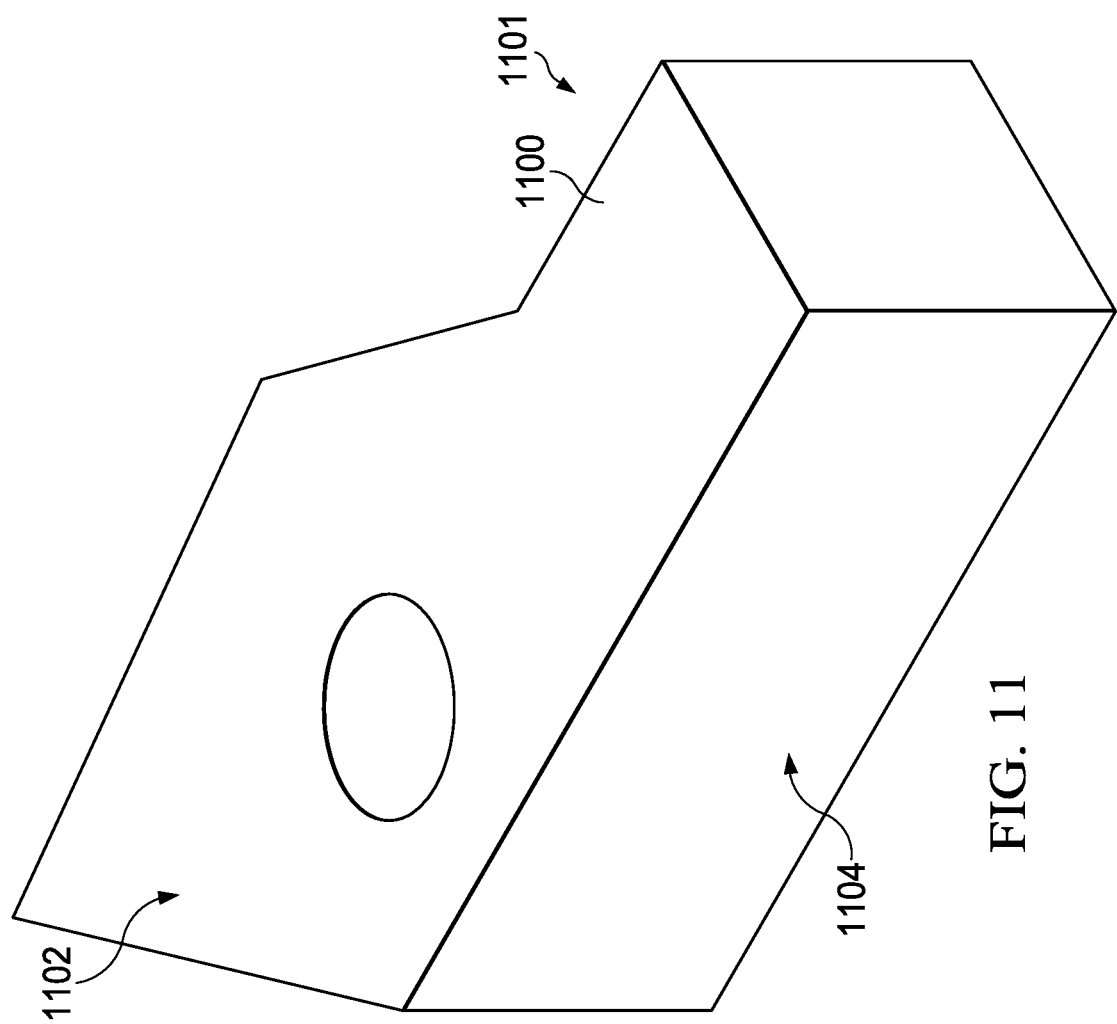
FIG. 11 is an illustration of a three-dimensional view of a desired part in accordance with an illustrative embodiment.

Turning to FIG. 11, an illustration of a three-dimensional view of a desired part is depicted in accordance with an illustrative embodiment. In this illustrative example, three-dimensional view 1100 of desired part 1101 is a display of desired part 1101 from the part model for desired part 1101.

Desired part 1101 in three-dimensional view 1100 has shape 1102 and volume 1104. Desired part 1101 may be designed based on specifications for the desired part described by the part model.

When a user initiates a search, product management software may prompt the user to select a part model as a search parameter to conduct a search of a database of existing part models. For example, the part model may be one created by the user. In one illustrative example, the product management software may prompt the user to provide a file location. In another illustrative example, the product management software may give the user the option to design a new model using a part designer. In this illustrative example, the user selects the desired part model for desired part 1101.

In FIG. 12, an illustration of a graphical user interface is depicted in accordance with an illustrative embodiment. In this depicted example, graphical user interface 1200 is an example of an implementation for user interface 126 in display system 124 shown in block form in FIG. 1.

As illustrated, a user may input deviations 1202 for desired part 1101 in FIG. 11 using graphical user interface 1200. For instance, a user may input values for deviations 1202 from desired part 1101 into graphical user interface 1200 selected from one of dimensions, a weight, an area, a wetted area, or other suitable values. Deviations 1202 represent an amount of acceptable deviation from the desired part model.

In this illustrative example, deviations 1202 increase the number of existing parts described by the part models that fall within the search parameters of the user. The user may enter deviations 1202 individually in graphical user interface 1200 or select a global deviation.

Figure 13:
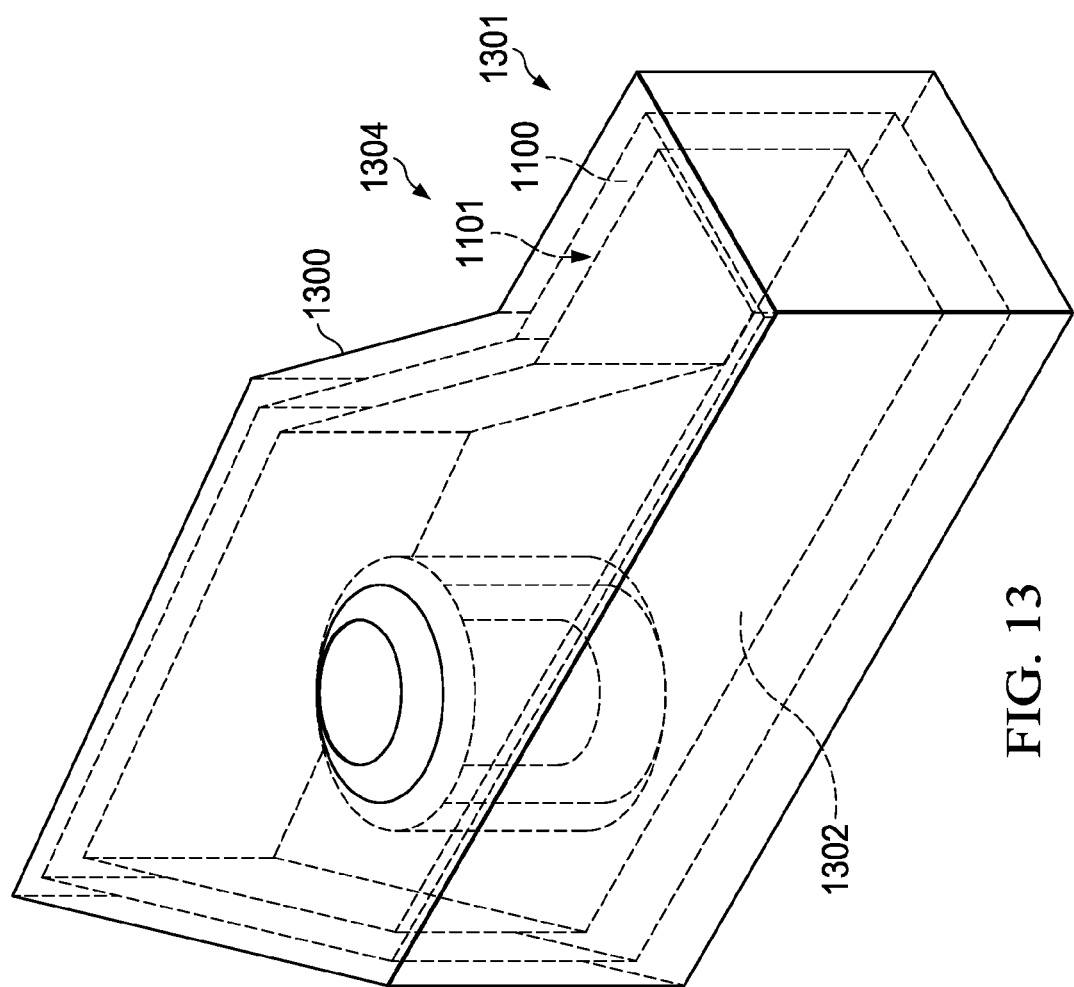
FIG. 13 is an illustration of a three-dimensional view of a scaled part in accordance with an illustrative embodiment.

Turning now to FIG. 13, an illustration of a three-dimensional view of a scaled part is depicted in accordance with an illustrative embodiment. In this depicted example, desired part 1101 in three-dimensional view 1100 from FIG.

11 has been scaled based on deviations 1202 defined by the user in graphical user interface 1200 in FIG. 12. Three-dimensional view 1301 shows scaled part 1304.

As depicted, the product management software uses a part designer to generate maximum volume boundary 1300 and minimum volume boundary 1302. The maximum volume boundary 1300 and minimum volume boundary 1302 have volume values in this illustrative example.

The product management software then uses the volume values for maximum volume boundary 1300 and minimum volume boundary 1302 to search the database of existing part models. The volume values corresponding to maximum volume boundary 1300 and minimum volume boundary 1302 form a range of volume values for analysis.

In some examples, the product management software uses the desired part model with maximum volume boundary 1300 and minimum volume boundary 1302 to generate three-dimensional view 1301 of scaled part 1304 and may display three-dimensional view 1301 of scaled part 1304 on a display device in a display system. This display of three-dimensional view 1301 of scaled part 1304 may assist the user in determining whether deviations 1202 are appropriate for the desired part. Accordingly, the user can adjust deviations 1202 such that three-dimensional view 1301 of scaled part 1304 is displayed in a desired manner.

In searching the database for potential matches, the product management software first eliminates part models in the database based on volume values and shapes. For example, a total volume of each part corresponding to a part model in the database is compared to the volume value for maximum volume boundary 1300 and the volume value for minimum volume boundary 1302 of the scaled part model. Parts with total volumes that are not within these volume values for scaled part 1304 are eliminated from the possible results.

Figure 14:
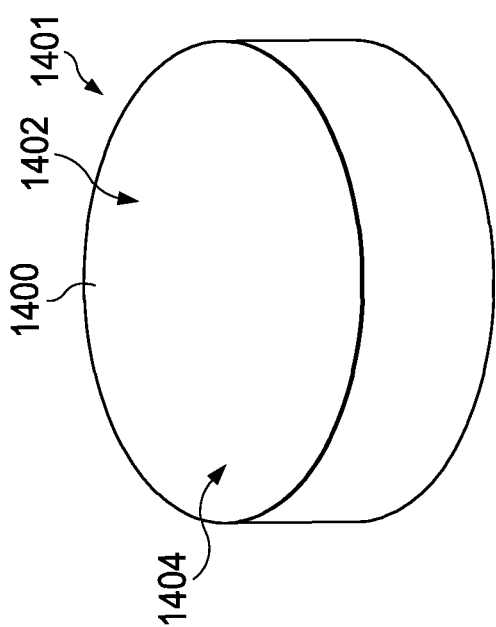
FIG. 14 is an illustration of a three-dimensional view of a candidate part in accordance with an illustrative embodiment.

Referring next to FIG. 14, an illustration of a three-dimensional view of a candidate part is depicted in accordance with an illustrative embodiment. In this depicted example, three-dimensional view 1400 of candidate part 1401 is used to illustrate how comparison of parts occurs. In particular, three-dimensional view 1400 of candidate part 1401 illustrates comparison of candidate part 1401 to the shape of maximum volume boundary 1300 and minimum volume boundary 1302 of scaled part 1304 from FIG. 13. Candidate part 1401 is an existing part with a corresponding part model stored in the database.

A selection of the part model corresponding to candidate part 1401 begins the shape analysis performed by the product management software in this illustrative example. Candidate part 1401 has a shape and a volume shown as shape 1402 and volume 1404 in three-dimensional view 1400 of candidate part 1401. The volume value for candidate part 1401 falls within the range specified for maximum volume boundary 1300 and minimum volume boundary 1302 for scaled part 1304 from FIG. 13. Therefore, a shape analysis of candidate part 1401 may be completed.

Figure 15:
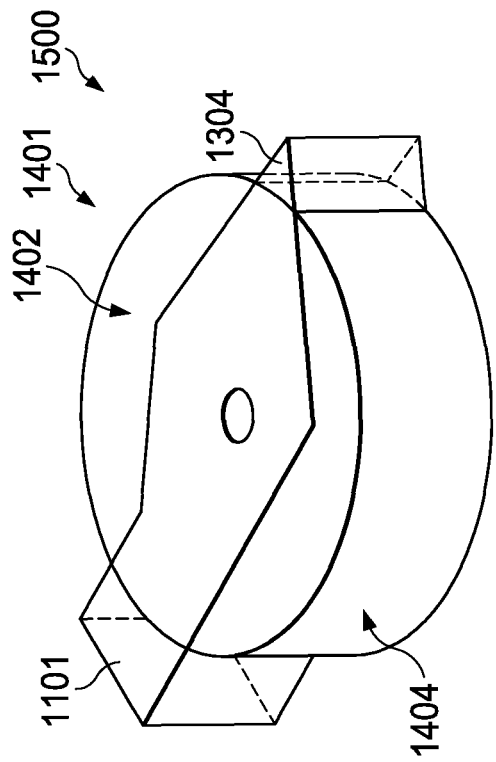
FIG. 15 is an illustration of a three-dimensional view of a candidate part and a desired part in accordance with an illustrative embodiment.

In FIG. 15, an illustration of a three-dimensional view of a candidate part and a desired part is depicted in accordance with an illustrative embodiment. In this depicted example, three-dimensional view 1500 is a three-dimensional view of desired part 1101 and candidate part 1401.

In this illustrative example, desired part 1101 with a maximum volume boundary is shown in phantom. In other words, the maximum volume boundary for desired part 1101 is being compared to candidate part 1401. In three-dimensional view 1500, desired part 1101 is placed over candidate part 1401.

In one illustrative example, a shape comparison is accomplished using Boolean Logic tools in a part designer. In particular, the shape comparison may be completed using tools available in computer-aided design software. In other illustrative examples, a statistical method could be employed in which a program would populate and compare a series of points or vectors on desired part 1101 with a series of points or vectors on parts within a database. The program could then calculate an average variance between desired part 1101 and any part in the database, such as candidate part 1401. The accuracy of this method would be dependent on the ratio of number of points or vectors employed to the surface area of the part. Alternatively, other tools exist in some currently used product management software which could be used to compare the desired part volume to the actual part volume of a part in the database.

As illustrated, desired part 1101 with its maximum volume boundary is compared to the volume of candidate part 1401. If any portion of candidate part 1401 lies outside the maximum boundary of desired part 1101, candidate part 1401 will be removed from the list of possible results. As shown in three-dimensional view 1500, a portion of candidate part 1401 lies outside of the maximum volume boundary for desired part 1101.

In FIG. 16, an illustration of a three-dimensional view of resultant geometry from a shape comparison is depicted in accordance with an illustrative embodiment. In this depicted example, Boolean subtraction has been performed to remove desired part 1101 with the maximum volume boundary from candidate part 1401. As depicted, three-dimensional view 1600 of resultant geometry 1602 represents the portion of candidate part 1401 that lies outside of the maximum volume boundary for desired part 1101.

With reference to FIG. 17, an illustration of a three-dimensional view of a candidate part and a desired part is depicted in accordance with an illustrative embodiment. In this depicted example, desired part 1101 with a minimum volume boundary is shown in phantom. Three-dimensional view 1700 shows desired part 1101 placed over candidate part 1401.

As illustrated, desired part 1101 with the minimum volume boundary is compared to candidate part 1401. If any portion of desired part 1101 with the minimum volume boundary lies outside of candidate part 1401, candidate part 1401 and its respective part model will be removed from the list of possible results. In other words, if candidate part 1401 completely envelops the minimum volume boundary of desired part 1101, candidate part 1401 may be retrieved for display in an assembly model. In three-dimensional view 1700, a portion of the minimum volume boundary for desired part 1101 lies outside of the candidate part.

In FIG. 18, an illustration of a three-dimensional view of resultant geometry from a shape comparison is depicted in accordance with an illustrative embodiment. In this depicted example, Boolean subtraction has been performed to remove candidate part 1401 from the minimum volume boundary for desired part 1101. As depicted, three-dimensional view 1800 of resultant geometry 1802 represents the portion of the minimum volume boundary of desired part 1101 that lies outside of candidate part 1401.

The process repeats itself for each of the candidate part models from the database. At this point, the product management software would have enough information to return results. These results may be a list of results. In other illustrative examples, these results may be populated in an assembly model. All candidate part models that lie completely within the maximum volume boundary and completely envelop the minimum volume boundary of desired part 1101 would be displayed to the user in a three-dimensional view of candidate parts in an assembly model. In this manner, an illustrative embodiment conducts a search of parts and corresponding part models based on a volumetric comparison of the parts with a desired part.

The illustrations of the three-dimensional views of parts and prisms in FIGS. 5-18 are not meant to imply physical or architectural limitations to the manner in which an illustrative embodiment may be implemented. Other components in addition to or in place of the ones illustrated may be used. Some components may be optional.

The different components shown in FIGS. 5-18 may be illustrative examples of how components shown in block form in FIGS. 1-4 can be implemented as physical structures. Additionally, some of the components in FIGS. 5-18 may be combined with components in FIGS. 1-4, used with components in FIG. 1-4, or a combination of the two.

Figure 19:
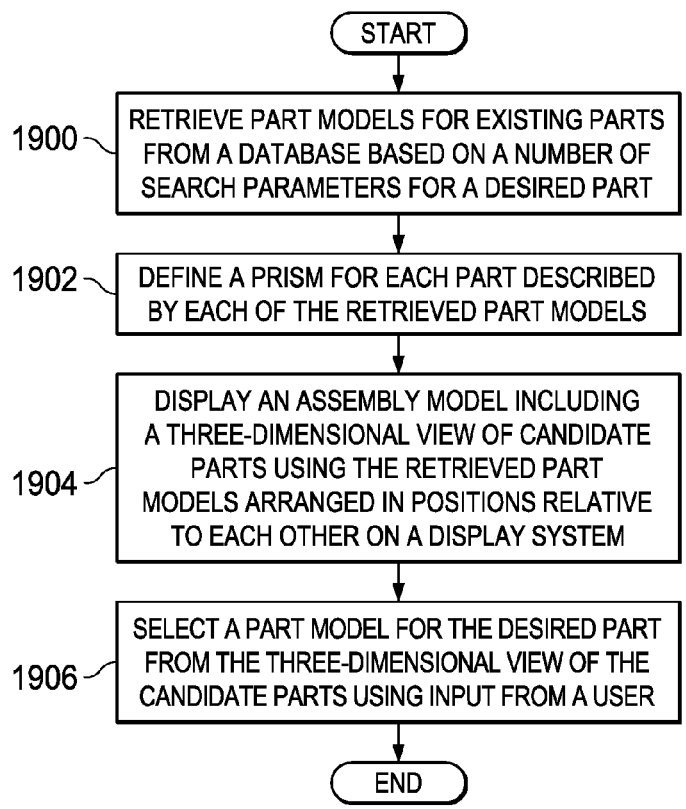
FIG. 19 is an illustration of a flowchart of a process for managing a desired part in accordance with an illustrative embodiment.

With reference now to FIG. 19, an illustration of a flowchart of a process for managing a desired part is depicted in accordance with an illustrative embodiment. In this depicted example, the process described in FIG. 19 is an example of a process implemented in product management environment 100 using product management system 109 in FIG. 1. In particular, the process described in FIG. 19 is an example of the operations that may be performed using product management software 116 in FIG. 1.

The process begins by retrieving part models for existing parts from a database based on a number of search parameters for the desired part (operation 1900). Thereafter, a prism is defined for each part described by each of the retrieved part models (operation 1902). The prism has a volume that completely contains a volume of a part corresponding to the each of the retrieved part models. The process then displays an assembly model including a three-dimensional view of candidate parts using the retrieved part models arranged in positions relative to each other on the display system (operation 1904).

The three-dimensional view of the candidate parts is displayed in a side-by-side configuration in an order based on a number of characteristics of each prism such that the part model that most closely matches the desired part may be identified from the three-dimensional view displayed using the retrieved part models. In some cases, information about one or more of the candidate parts is displayed as well. The process then selects a part model for the desired part from the three-dimensional view of the candidate parts using input from a user (operation 1906) with the process terminating thereafter.

The desired part may be designed using the selected part model. For instance, a user may use the selected part model as a template to design the desired part. In other examples, the selected part model may be used in place of a part model created for the desired part. In some cases, the desired part may be manufactured using the selected part model.

Figure 20:
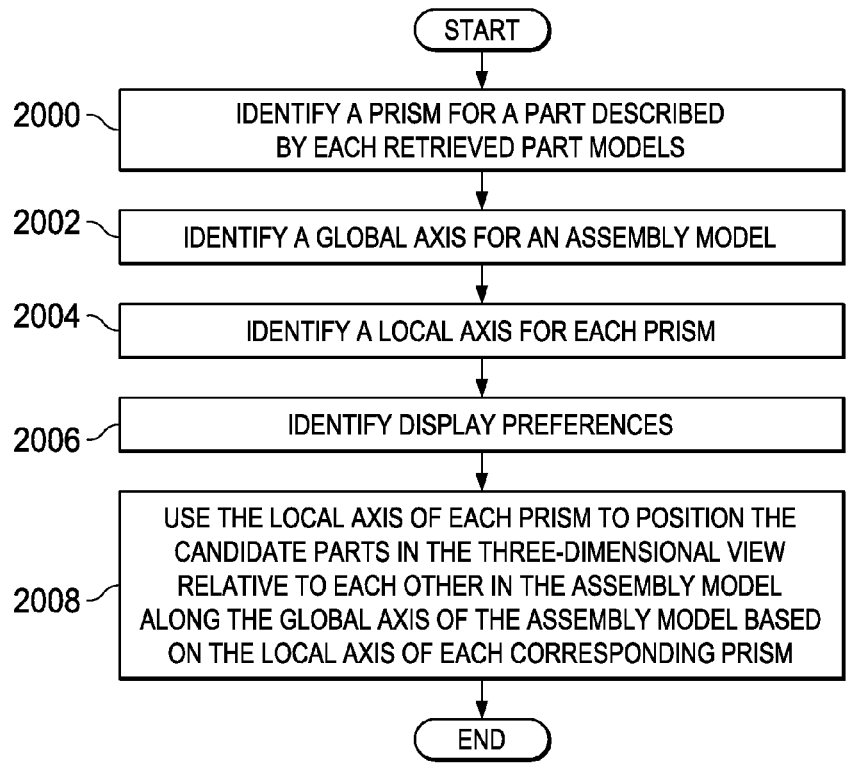
FIG. 20 is an illustration of a flowchart of a process for displaying a three-dimensional view of candidate parts using retrieved part models in an assembly model in accordance with an illustrative embodiment.

In FIG. 20, an illustration of a flowchart of a process for displaying a three-dimensional view of candidate parts using retrieved part models in an assembly model is depicted in accordance with an illustrative embodiment. In this depicted example, operations performed in FIG. 20 may be implemented during operation 1904 from FIG. 19 using product management software 116 to display three-dimensional view 133 of candidate parts 137 using retrieved part models 134 in assembly model 132 on display system 124 in FIG. 1.

The process begins by identifying a prism for a part described by each of the retrieved part models (operation 2000). The prism may be a rectangular prism in this illustrative example. Each prism has a volume that completely contains a part described in a part model in the retrieved part models.

Next, the process identifies a global axis for the assembly model (operation 2002). The global axis is a reference axis in this illustrative example. The three-dimensional view of the candidate parts described by the retrieved part models will be arranged along the global axis when displayed on display system 124.

The process then identifies a local axis for each prism (operation 2004). The local axis is identified for each prism corresponding to each of the candidate parts using the retrieved part models. Thereafter, the process identifies display preferences (operation 2006). These display preferences may include how many parts to display in the three-dimensional view for the assembly model, how much space should be between each part, or other suitable preferences. These preferences may be selected by a user or may be determined by product management software 116.

The process then uses the local axis of each prism to position the candidate parts in the three-dimensional view relative to each other in the assembly model along the global axis of the assembly model based on the local axis of each corresponding prism (operation 2008) with the process terminating thereafter.

In this illustrative example, the number of characteristics includes a volume of each of the prisms. In some cases, the local axis, the volume, and other data about the prism are stored in the database to be accessed in subsequent searches.

Figure 21:
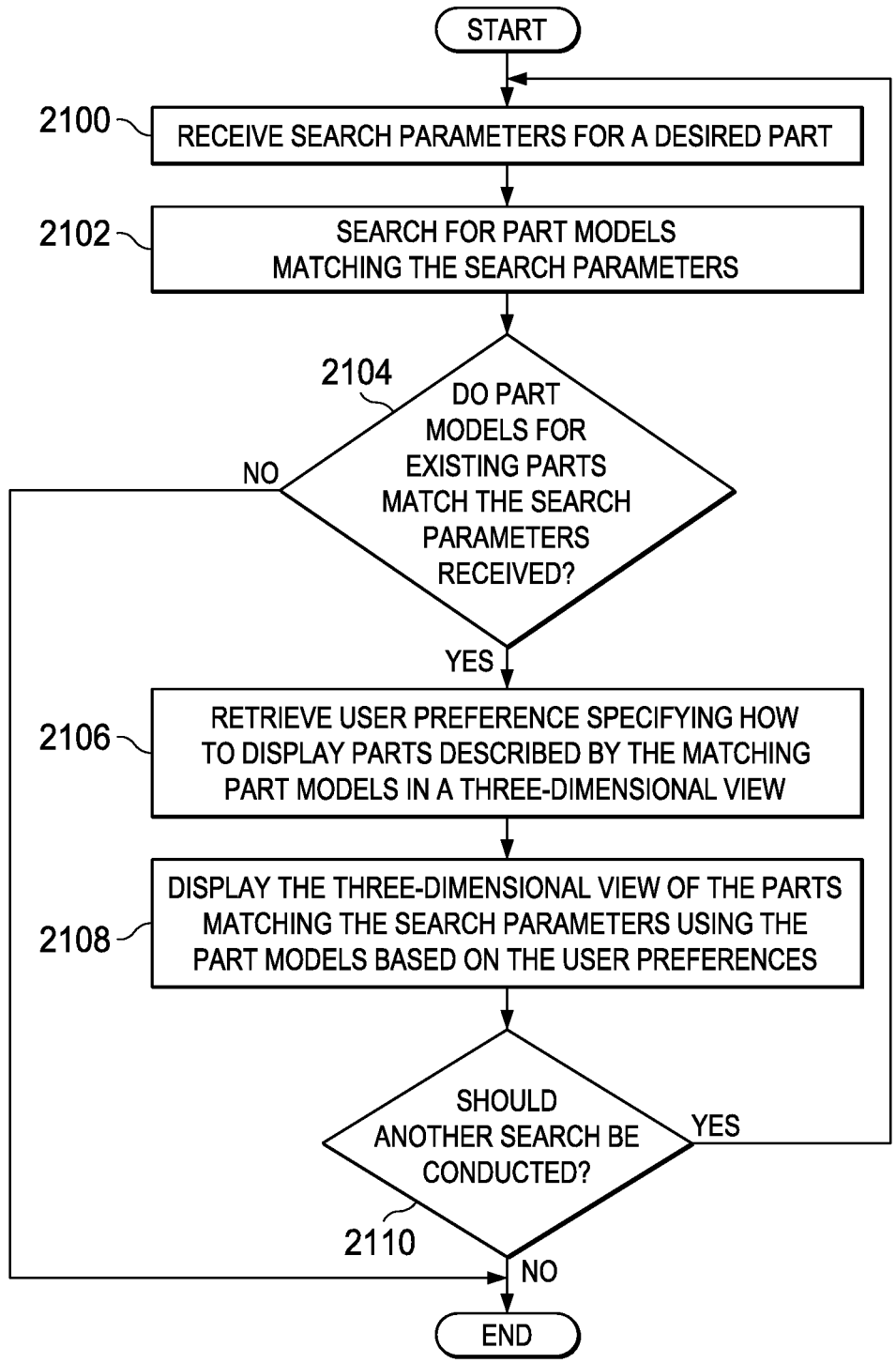
FIG. 21 is an illustration of a flowchart of a process for searching for part models for a desired part in accordance with an illustrative embodiment.

Turning next to FIG. 21, an illustration of a flowchart of a process for searching for part models for a desired part is depicted in accordance with an illustrative embodiment. In this depicted example, the process described in FIG. 21 is an example of a process implemented in product management environment 100 using product management system 109 in FIG. 1. In particular, the process described in FIG. 21 is an example of the operations that may be performed using product management software 116 in FIG. 1.

The process begins by receiving search parameters for a desired part (operation 2100). Next, the process searches for part models matching the search parameters (operation 2102). The search parameters may include a desired part model that may be selected by a user to use for a volumetric comparison between the desired part and various part models for existing parts.

A determination is made as to whether part models for existing parts match the search parameters received (operation 2104). If part models for existing parts match the search parameters received, then the process retrieves user preference specifying how to display parts described by the matching part models in a three-dimensional view (operation 2106). This three-dimensional view may be an assembly model displayed in a format such as a virtual shelf, a virtual store, or a virtual warehouse. The user preferences may specify how to arrange the parts by volume for the display.

Thereafter, a three-dimensional view of the parts matching the search parameters are displayed using the part models based on the user preferences (operation 2108). A determination is then made as to whether another search should be conducted (operation 2110).

If another search should be conducted, the process returns to operation 2100 as describe above. Otherwise, the process terminates. Returning to operation 2104, if no part models for existing parts match the search parameters, the process terminates.

Figure 22:
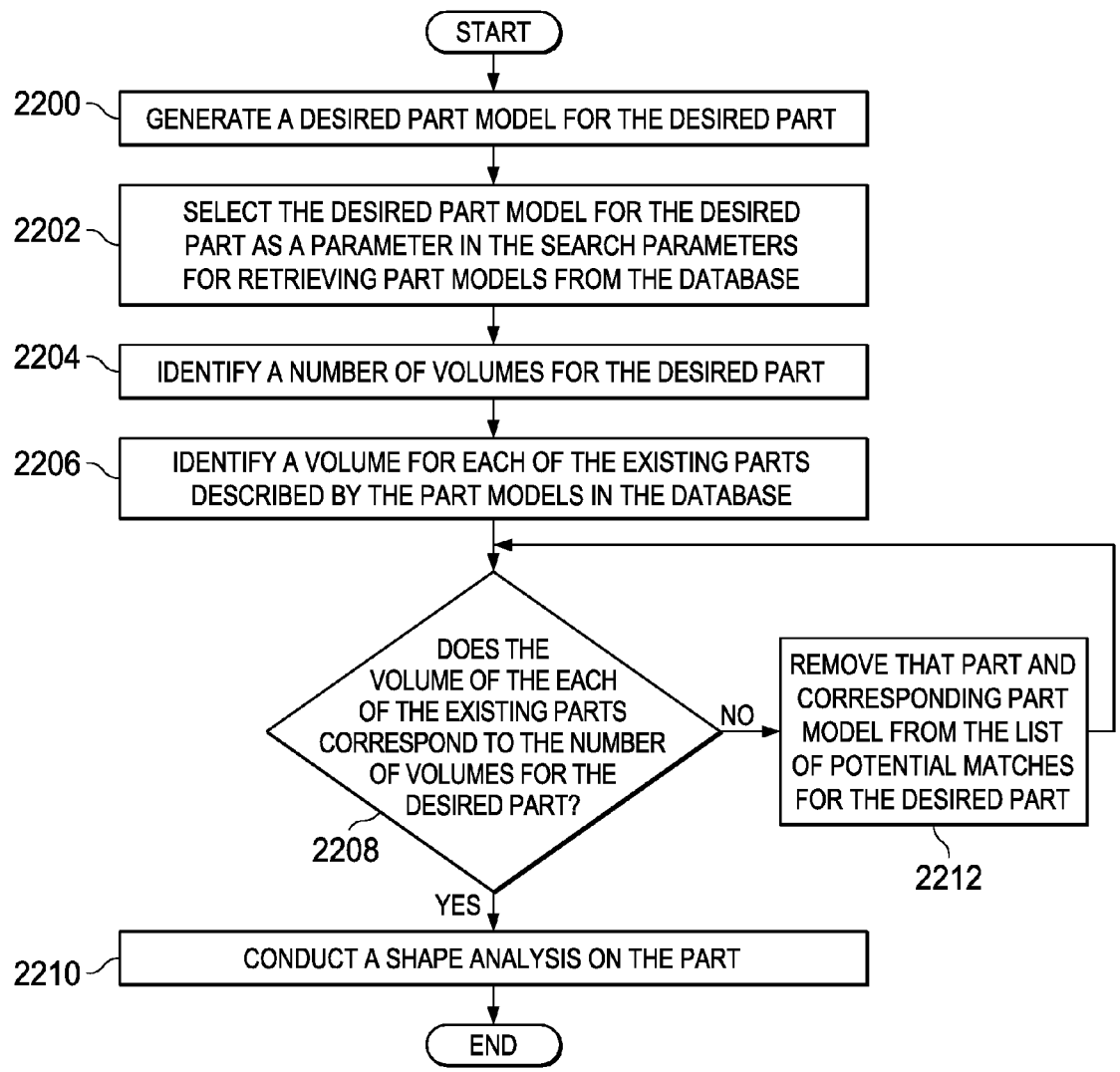
FIG. 22 is an illustration of a flowchart of a process for conducting a search based on volume for a desired part in accordance with an illustrative embodiment.

Turning next to FIG. 22, an illustration of a flowchart of a process for conducting a search based on volume for a desired part is depicted in accordance with an illustrative embodiment. In this depicted example, the process described in FIG. 22 is an example of a process implemented in product management environment 100 using product management system 109 in FIG. 1. In particular, the process described in FIG. 22 is an example of the operations that may be performed using product management software 116 in FIG. 1.

The process begins by generating a desired part model for the desired part (operation 2200). Next, the process selects the desired part model for the desired part as a parameter in the search parameters for retrieving part models from the database (operation 2202).

Thereafter, the process identifies a number of volumes for the desired part (operation 2204). The volumes may include a maximum volume and a minimum volume. Next, the process identifies a volume for each of the existing parts described by the part models in the database (operation 2206). A determination is then made as to whether the volume of the each of the existing parts corresponds to the number of volumes for the desired part (operation 2208). If the volume of a part corresponds to the number of volumes, the process conducts a shape analysis on the part (operation 2210) with the process terminating thereafter.

If the volume of the part does not correspond to the number of volumes, the process removes that part and corresponding part model from the list of potential matches for the desired part (operation 2212) and the process returns to operation 2208 until all of the volumes for the part models have been analyzed.

Figure 23:
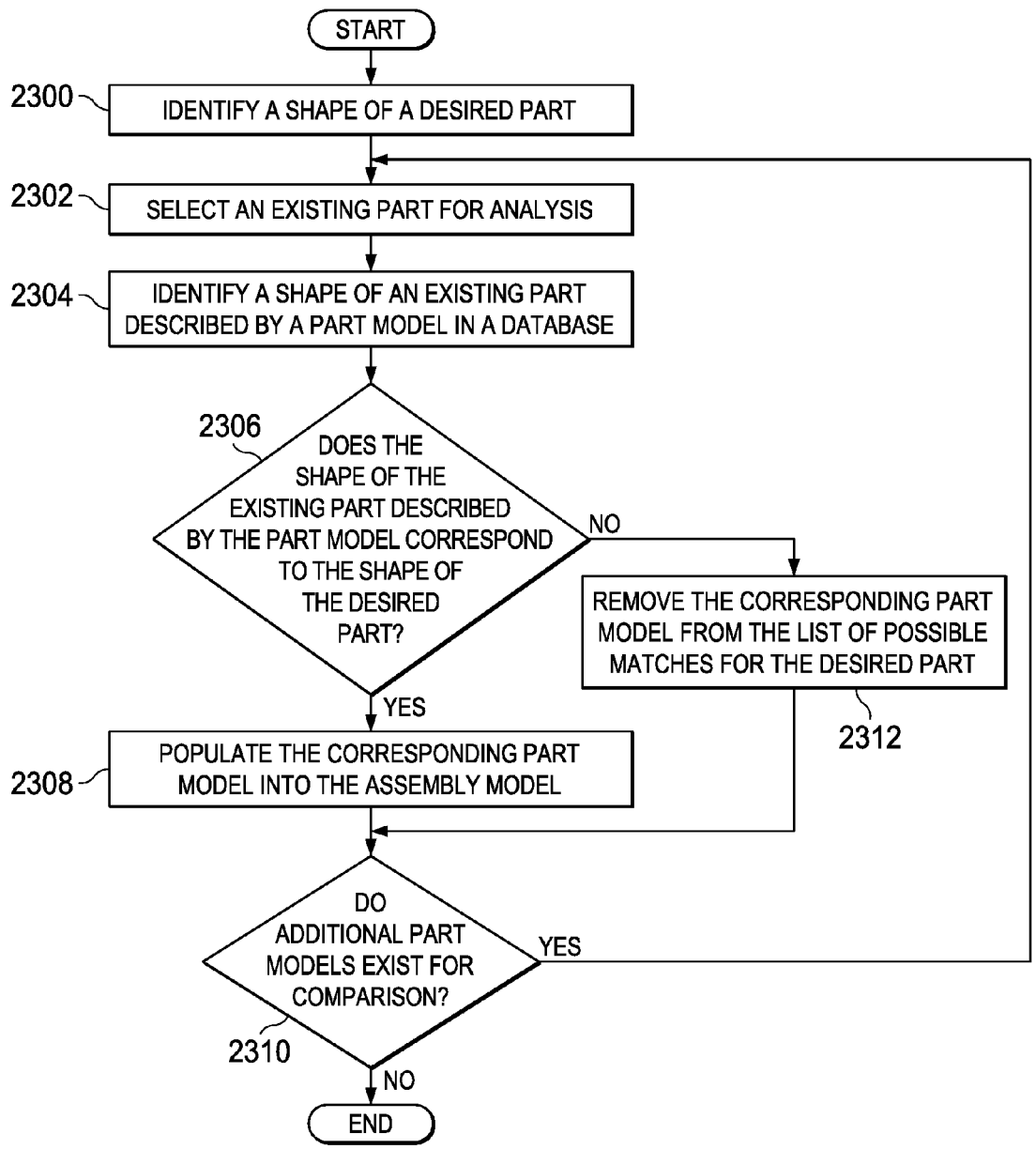
FIG. 23 is an illustration of a flowchart of a process for filtering a search based on the shape for a desired part in accordance with an illustrative embodiment.

With reference to FIG. 23, an illustration of a flowchart of a process for filtering a search based on the shape for a desired part is depicted in accordance with an illustrative embodiment. In this depicted example, the process described in FIG. 23 may be implemented in operation 2214 in FIG. 22 using product management software 116 in FIG. 1. In other words, after searching based on volume, the part models are filtered based on shape.

The process begins by identifying a shape of the desired part (operation 2300). The shape of the desired part may be identified using the maximum volume boundary and the minimum volume boundary of the scaled part model determined in FIG. 22.

The process then selects an existing part for analysis (operation 2302). Thereafter, the process identifies a shape of an existing part described by a part model in the database (operation 2304). Next, the process determines whether the shape of the existing part described by the part model corresponds to the shape of the desired part (operation 2306). If the shape of the existing part corresponds to the shape of the desired part, the corresponding part model is populated into the assembly model (operation 2308).

A determination is then made as to whether additional part models exist for comparison (operation 2310). If so, the process returns to operation 2302 as described above. In not, the process terminates.

Returning to operation 2306, if the shape of the existing part does not correspond to the shape of the desired part, the corresponding part model is removed from the list of possible matches for the desired part (operation 2312) and the process proceeds to operation 2310 as described above. The process continues until only the part models that have a corresponding volume and shape remain. Accordingly, only those part models are populated in the assembly model and the three-dimensional view of candidate parts for the desired part contains only those parts that closely match the desired part in both volume and shape.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Turning now to FIG. 24, an illustration of a data processing system in the form of a block diagram is depicted in accordance with an illustrative embodiment. Data processing system 2400 may be used to implement one or more computers in computer system 110 in FIG. 1. As depicted, data processing system 2400 includes communications framework 2402, which provides communications between processor unit 2404, storage devices 2416, communications unit 2410, input/output unit 2412, and display 2414. In some cases, communications framework 2402 may be implemented as a bus system.

Processor unit 2404 is configured to execute instructions for software to perform a number of operations. Processor unit 2404 may comprise a number of processors, a multi-processor core, and/or some other type of processor, depending on the implementation. In some cases, processor unit 2404 may take the form of a hardware unit, such as a circuit system, an application specific integrated circuit (ASIC), a programmable logic device, or some other suitable type of hardware unit.

Instructions for the operating system, applications, and/or programs run by processor unit 2404 may be located in storage devices 2416. Storage devices 2416 may be in communication with processor unit 2404 through communications framework 2402. As used herein, a storage device, also referred to as a computer readable storage device, is any piece of hardware capable of storing information on a temporary and/or permanent basis. This information may include, but is not limited to, data, program code, and/or other information.

Memory 2406 and persistent storage 2408 are examples of storage devices 2416. Memory 2406 may take the form of, for example, a random access memory or some type of volatile or non-volatile storage device. Persistent storage 2408 may comprise any number of components or devices. For example, persistent storage 2408 may comprise a hard drive, a flash memory, a rewritable optical disk, a rewritable magnetic tape, or some combination of the above. The media used by persistent storage 2408 may or may not be removable.

Communications unit 2410 allows data processing system 2400 to communicate with other data processing systems and/or devices. Communications unit 2410 may provide communications using physical and/or wireless communications links.

Input/output unit 2412 allows input to be received from and output to be sent to other devices connected to data processing system 2400. For example, input/output unit 2412 may allow user input to be received through a keyboard, a mouse, and/or some other type of input device. As another example, input/output unit 2412 may allow output to be sent to a printer connected to data processing system 2400.

Display 2414 is configured to display information to a user. Display 2414 may comprise, for example, without limitation, a monitor, a touch screen, a laser display, a holographic display, a virtual display device, and/or some other type of display device.

In this illustrative example, the processes of the different illustrative embodiments may be performed by processor unit 2404 using computer-implemented instructions. These instructions may be referred to as program code, computer usable program code, or computer readable program code and may be read and executed by one or more processors in processor unit 2404.

In these examples, program code 2418 is located in a functional form on computer readable media 2420, which is selectively removable, and may be loaded onto or transferred to data processing system 2400 for execution by processor unit 2404. Program code 2418 and computer readable media 2420 together form computer program product 2422. In this illustrative example, computer readable media 2420 may be computer readable storage media 2424 or computer readable signal media 2426.

Computer readable storage media 2424 is a physical or tangible storage device used to store program code 2418 rather than a medium that propagates or transmits program code 2418. Computer readable storage media 2424 may be, for example, without limitation, an optical or magnetic disk or a persistent storage device that is connected to data processing system 2400.

Alternatively, program code 2418 may be transferred to data processing system 2400 using computer readable signal media 2426. Computer readable signal media 2426 may be, for example, a propagated data signal including program code 2418. This data signal may be an electromagnetic signal, an optical signal, and/or some other type of signal that can be transmitted over physical and/or wireless communications links.

The illustration of data processing system 2400 in FIG. 24 is not meant to provide architectural limitations to the manner in which the illustrative embodiments may be implemented. The different illustrative embodiments may be implemented in a data processing system that includes components in addition to or in place of those illustrated for data processing system 2400. Further, components shown in FIG. 24 may be varied from the illustrative examples shown.

Illustrative embodiments of the disclosure may be described in the context of aircraft manufacturing and service method 2500 as shown in FIG. 25 and aircraft 2600 as shown in FIG. 26. Turning first to FIG. 25, an illustration of a block diagram of an aircraft manufacturing and service method is depicted in accordance with an illustrative embodiment. During pre-production, aircraft manufacturing and service method 2500 may include specification and design 2502 of aircraft 2600 in FIG. 26 and material procurement 2504.

During production, component and subassembly manufacturing 2506 and system integration 2508 of aircraft 2600 in FIG. 26 takes place. Thereafter, aircraft 2600 may go through certification and delivery 2510 in order to be placed in service 2512. While in service 2512 by a customer, aircraft 2600 in FIG. 26 is scheduled for routine maintenance and service 2514, which may include modification, reconfiguration, refurbishment, and other maintenance or service.

Each of the processes of aircraft manufacturing and service method 2500 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 26, an illustration of a block diagram of an aircraft is depicted in which an illustrative embodiment may be implemented. In this example, aircraft 2600 is produced by aircraft manufacturing and service method 2500 in FIG. 25 and may include airframe 2602 with systems 2604 and interior 2606. Examples of systems 2604 include one or more of propulsion system 2608, electrical system 2610, hydraulic system 2612, and environmental system 2614. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 2500 in FIG. 25. For example, one or more illustrative embodiments may be implemented during system integration 2508. The different illustrative examples may be implemented to identify information to perform tasks to assemble parts on aircraft 2600.

In particular, the visual query of aircraft may be used to identify locations where tasks for shop order instances are to be performed or where tasks have been performed. Additionally, an illustrative embodiment also may be implemented during maintenance and service 2514. For example, information about the aircraft may be visually queried and viewed by an operator to perform tasks to assemble parts for maintenance, upgrades, refurbishment, and other operations during maintenance and service 2514 may be identified using an illustrative embodiment.

Figure 27:
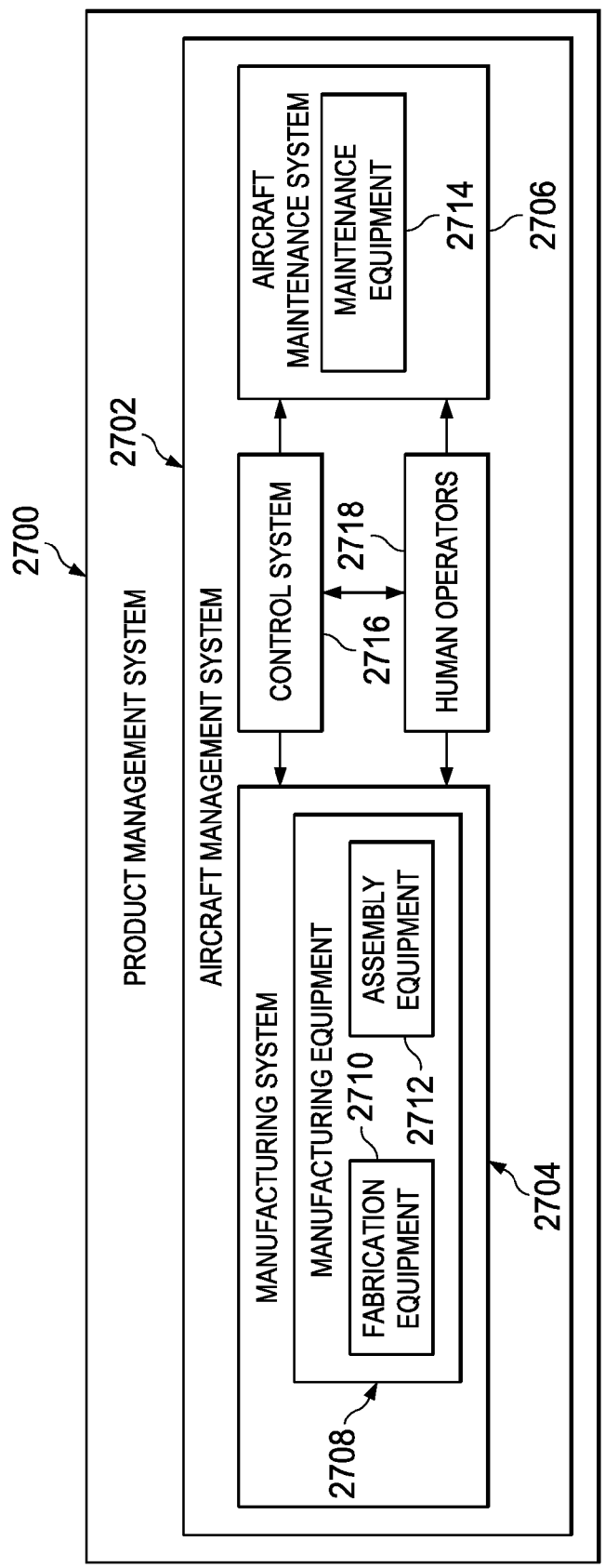
FIG. 27 is an illustration of a block diagram of a management system in accordance with an illustrative embodiment.

Turning now to FIG. 27, an illustration of a block diagram of a management system is depicted in accordance with an illustrative embodiment. As depicted, product management system 2700 takes the form of aircraft management system 2702. Aircraft management system 2702 is a physical hardware system. In this illustrative example, aircraft management system 2702 may include at least one of manufacturing system 2704 or aircraft maintenance system 2706.

Manufacturing system 2704 is configured to manufacture products, such as aircraft 2600 in FIG. 26. In this manner, manufacturing system 2704 may take the form of an aircraft manufacturing system in this illustrative example. As depicted, manufacturing system 2704 includes manufacturing equipment 2708. Manufacturing equipment 2708 includes at least one of fabrication equipment 2710 or assembly equipment 2712.

Fabrication equipment 2710 is equipment that may be used to fabricate components for parts used to form aircraft 2600. For example, fabrication equipment 2710 may include machines and tools. These machines and tools may be at least one of a drill, a hydraulic press, a furnace, a mold, a composite tape laying machine, a vacuum system, a lathe, or other suitable types of equipment. Fabrication equipment 2710 may be used to fabricate at least one of metal parts, composite parts, semiconductors, circuits, fasteners, ribs, skin panels, spars, antennas, or other suitable types of parts.

Assembly equipment 2712 is equipment used to assemble parts to form aircraft 2600. In particular, assembly equipment 2712 may be used to assemble components and parts to form aircraft 2600. Assembly equipment 2712 also may include machines and tools. These machines and tools may be at least one of a robotic arm, a crawler, a faster installation system, a rail-based drilling system, or a robot. Assembly equipment 2712 may be used to assemble parts such as seats, horizontal stabilizers, wings, engines, engine housings, landing gear systems, and other parts for aircraft 2600.

In this illustrative example, aircraft maintenance system 2706 includes maintenance equipment 2714. Maintenance equipment 2714 may include any equipment needed to perform maintenance on aircraft 2600. This maintenance may include tools for performing different operations on parts on aircraft 2600. These operations may include at least one of disassembling parts, refurbishing parts, inspecting parts, reworking parts, manufacturing placement parts, or other operations for performing maintenance on aircraft 2600. These operations may be for routine maintenance, inspections, upgrades, refurbishment, or other types of maintenance operations.

In the illustrative example, maintenance equipment 2714 may include ultrasonic inspection devices, x-ray imaging systems, vision systems, drills, crawlers, and other suitable devices. In some cases, maintenance equipment 2714 may include fabrication equipment 2710, assembly equipment 2712, or both to produce and assemble parts that may be needed for maintenance.

Aircraft management system 2702 also includes control system 2716. Control system 2716 is a hardware system and may also include software or other types of components. Control system 2716 is configured to control the operation of at least one of manufacturing system 2704 or aircraft maintenance system 2706. In particular, control system 2716 may control the operation of at least one of fabrication equipment 2710, assembly equipment 2712, or maintenance equipment 2714.

The hardware in control system 2716 may be using hardware that may include computers, circuits, networks, and other types of equipment. The control may take the form of direct control of manufacturing equipment 2708. For example, robots, computer-controlled machines, and other equipment may be controlled by control system 2716. In other illustrative examples, control system 2716 may manage operations performed by human operators 2718 in manufacturing or performing maintenance on aircraft 2600. Additionally, one or more of human operators 2718 may operate control system 2716. Further, control system 2716 may be centralized or distributed. In some illustrative examples, control system 2716 may be located in computer systems, in manufacturing equipment 2708 or in other locations.

In the illustrative example, manufacturing equipment 2708 use part models to manufacture physical parts. Depending on the particular implementation, these part models may be used directly or indirectly by manufacturing equipment 2708.

For example, manufacturing equipment 2708 may receive part models from control system 2716. Manufacturing equipment 2708 may then manufacture the physical parts using the part models. In another illustrative example, control system 2716 may send information to manufacturing equipment 2708. Using the part models. For example, information may include at least one of instructions, program code, images, and other suitable types of information. In this manner, manufacturing equipment 2708 may directly or indirectly use the part models to manufacture physical parts.

In these illustrative examples, product management software 116 in FIG. 1 may be implemented in control system 2716 to manage at least one of the manufacturing or maintenance of aircraft 2600 in FIG. 26.

In the different illustrative examples, human operators 2718 may operate or interact with at least one of manufacturing equipment 2708, maintenance equipment 2714, or control system 2716. This interaction may be performed to manufacture aircraft 2600.

In these illustrative examples, product management system 109 in FIG. 1 may be implemented in manufacturing system 2704 to manage the manufacturing of aircraft 2600 in FIG. 26. In the different illustrative examples, human operators 2718 may operate or interact with at least one of manufacturing equipment 2708 or control system 2716. This interaction may be performed to manufacture aircraft 2600.

Of course, aircraft management system 2702 may be configured to manage other products other than aircraft 2600. Although aircraft management system 2702 has been described with respect to manufacturing in the aerospace industry, aircraft management system 2702 may be configured to manage products for other industries. For example, aircraft management system 2702 may be configured to manufacture products, perform maintenance for products, or some combination thereof for the automotive industry, shipbuilding industry, consumer products industry, as well as any other suitable industries. In these other illustrative examples, aircraft management system 2702 may take the form of a product management system for performing at least one of manufacturing or maintenance of a product.

Further, with an ability to visualize the physical parts for different existing part models of assembly for aircraft 2600, the management of operations performed by manufacturing system 2704 may occur in a manner that reduces the time to manufacture aircraft 2600, increases the efficiency in manufacturing aircraft 2600, increases efficiency in assigning shop order instances for manufacturing aircraft 2600, and other suitable goals.

For example, when designing a part, existing part models may be used to design the part. When an existing part model is selected, a more efficient design process for the part occurs. For instance, operations such as testing, certification, identifying suppliers, negotiating contracts for parts, and other operations in designing a part used in aircraft 2600 may be reduced and in some cases eliminated. As a result, the assembly of aircraft 2600 with the new part may be completed more efficiently than with some currently used produce management systems.

In another illustrative example, an existing part model may be selected and modified after viewing the assembly displayed on a display system. The existing part model may be used as a basis for the desired part that is being designed. With an identification of materials, processes, or steps used to manufacture the physical part, test data, and other information that may be present in the existing part model, time, expense, or both may be reduced in designing the desired part using the existing part model.

Thus, the illustrative embodiments provide a method and system for designing desired part 108. Part models 123 for existing parts 107 are retrieved from database 120 of plurality of part models 122 of existing parts 107 based on search parameters 130 for desired part 108. Prism 302 having volume 304 that completely contains a volume of a part corresponding to the each of retrieved part models 134 is defined for the each of retrieved part models 134. Assembly model 132 including three-dimensional view 133 of candidate parts 137 using retrieved part models 134 arranged in positions 200 relative to each other is displayed on display system 124. Candidate parts 137 in three-dimensional view 133 are displayed in side-by-side configuration 202 in order 204 based on number of characteristics 306 of each prism 302 such that part model 136 that most closely matches desired part 108 may be identified. Part model 136 for desired part 108 is selected from retrieved part models 134 using input 128. Desired part 108 is designed using selected part model 136.

With the use of an illustrative embodiment, a volumetric comparison of a desired part and a number of candidate parts may be completed. This volumetric comparison may include a comparison of both total volume and a shape of a desired part to part models for existing parts in a database. In this manner, an assembly model including part models closely matching the volume and shape of the desired part may be populated and displayed in a three-dimensional view to the user. A user may select a part model from the assembly model to use as a template for designing the desired part. The selection is made in the illustrative examples through the user viewing a three-dimensional view of the different part models in the assembly model. In other words, the user is able to view the parts described in the part models.

In some cases, the user may realize that the exact part needed has already been designed. In either case, significant savings of time may be realized. As a result, the cost of designing new parts, redesigning existing parts, or both, may be reduced. Moreover, because the part models of the existing parts contain information about testing, materials, certifications, and dimensions, among other things, users may quickly determine whether an existing part will be suitable for a particular use.

Searches may be conducted based on parts within an organization of the user, outside of the organization of the user, or both. In some cases, the product management system may include an online platform that allows users to search databases of part models at other organizations. This decreases the likelihood of duplicate parts being designed and streamlines the design of desired parts for aircraft and other vehicles.

In other illustrative examples, the selected part model may be used to manufacture the desired part. In one example, manufacturing may include three-dimensional printing of the desired part.

Additionally, the illustrative embodiments provide an efficient and intuitive method for displaying parts in an assembly model. By identifying a prism, spacing, and arranging the three-dimensional view of matching part models along a global axis, the part models may be easily populated in the assembly model and identified or analyzed by the user. In other words, the three-dimensional view of each part model may be displayed along the global axis in a manner that allows for comparison of the different parts described by the part models. In displaying the assembly model as a virtual part store, selection of a part model for the desired part is conducted in an intuitive manner for the user.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system for selecting a part that most closely matches a desired part from a plurality of part models, such that the system comprises:
    a memory that comprises a database that comprises the plurality of part models for existing parts;
    a user interface configured to receive input of a number of search parameters for the desired part;
    a processor unit; and
    product management software configured for execution by the processor unit and specially programed to:
        retrieve part models from the database for existing parts based on the number of search parameters, the processor unit specially programed to:
            define, for each of retrieved part models, a prism that comprises a volume that completely contains a volume of a part corresponding to the each of the retrieved part models;
            receive acceptable deviations for each parameter of the number of search parameters, such that the acceptable deviations define a scaled part that comprises a maximum volume boundary for the desired part and a minimum volume boundary for the desired part;
            select candidate parts from the retrieved part models, such that the candidate parts each comprise a total volume that lies between a total volume of the maximum volume boundary and a total volume of the minimum volume boundary;
            eliminate, responsive to a shape analysis, a candidate part from the candidate parts based at least upon a portion of the minimum volume boundary for the desired part lying outside the candidate part, such that the shape analysis comprises:
                a first Boolean logic subtraction of a shape, comprising the maximum volume boundary, of the desired part, from a shape of the candidate part; and
                a second Boolean logic subtraction of the shape of the candidate part from a shape, comprising the minimum volume boundary, of the desired part; and
        display, on a display system, an assembly model that comprises a three-dimensional view of remaining candidate parts that comprises the retrieved part models arranged in positions relative to each other, such that the display comprises the candidate parts in the three-dimensional view displayed in a side-by-side configuration along a global axis in an order, based on a number of characteristics of each prism, configured to identify a part model that most closely matches the desired part.

2. The system of claim 1, further comprising:
    either Boolean subtraction comprising a resultant;
    the existing parts selected from existing parts for at least one of: an aircraft, a ground vehicle, a spacecraft, a vehicle, a train, a truck, a building, a bridge, an engine; and
    the three-dimensional view comprises a format selected from at least one of: a virtual shelf, a virtual store, and a virtual warehouse.

3. A method for managing a desired part, the method comprising:
- retrieving, using a number of search parameters for the desired part, part models for existing parts from a database, forming retrieved part models;
- defining, for each part described by the retrieved part models, a prism respectively comprising a volume that completely contains a volume of a part corresponding to each of the retrieved part models;
- receiving, in a specially programmed processor, acceptable deviations for each parameter of the number of search parameters, the acceptable deviations defining a scaled part comprising a maximum volume boundary for the desired part and a minimum volume boundary for the desired part;
- selecting candidate parts from the retrieved part models, the candidate parts each comprising a total volume that lies between a total volume of the maximum volume boundary and a total volume of the minimum volume boundary;
- eliminating, responsive to a shape analysis, a candidate part from the candidate parts based at least upon a portion of the minimum volume boundary for the desired part lying outside the candidate part, the shape analysis comprising:
  - subtracting, using a first Boolean logic, a shape, comprising a maximum volume boundary, of the desired part from a shape of the candidate part; and
  - subtracting, using a second Boolean logic, the shape of the candidate part from a shape, comprising the minimum volume boundary, of the desired part;
- displaying, using a number of characteristics of each prism such that a part model that most closely matches the desired part, on a display system, an assembly model comprising a three-dimensional view of the remaining candidate parts arranged in a side-by-side configuration along a global axis in an order identifying the desired part; and
- selecting, using input from a user, a part model for the desired part from the three-dimensional view of the remaining candidate parts, such that the desired part comprises a selected part model.

4. The method of claim 3 further comprising:
- the shape analysis comprising either Boolean subtraction comprising a resultant; and
- manufacturing the desired part using the selected part model.

5. The method of claim 3, further comprising:
- the shape analysis comprising at least one of:
  - a boundary of the shape of the candidate part lying outside the maximum volume boundary, or the minimum volume boundary lying outside a boundary of the shape of the candidate part; and
  - the number of search parameters comprising at least one of a volume, a material, dimensions, a part type, or a part number for the desired part.

6. The method of claim 3 further comprising:
- generating a desired part model for the desired part; and
- selecting the desired part model for the desired part as one of the number of search parameters.

7. The method of claim 3, wherein retrieving the part models comprises:
- identifying a number of volumes for the desired part; and
- identifying a shape of the desired part.

8. The method of claim 7 further comprising:
- identifying a volume for each of the existing parts described by part models in the database; and
- determining whether the volume of the each of the existing parts corresponds to the number of volumes for the desired part.

9. The method of claim 8 further comprising:
- identifying the shape of the each of the existing parts described by the part models in the database;
- determining whether the shape of the each of the existing parts described by the part models corresponds to the shape of the desired part; and
- populating the candidate parts using the retrieved part models from the part models in the database based on whether the volume and the shape of the each of the existing parts corresponds to the volume and the shape of the desired part.

10. The method of claim 3, wherein displaying the assembly model comprises:
- identifying a global axis to position the candidate parts in the three-dimensional view relative to each other; and
- identifying a local axis for the each prism corresponding to each of the candidate parts using the retrieved part models.

11. The method of claim 10 further comprising:
- positioning the candidate parts in the three-dimensional view relative to each other in the assembly model along the global axis based on the local axis of a corresponding prism.

12. The method of claim 10, wherein displaying the assembly model comprises a format selected from at least one of: a virtual shelf, a virtual store, and a virtual warehouse.

13. The method of claim 3, wherein the number of characteristics is selected from at least one of a volume, a diameter, a length, or an area of a side.

14. The method of claim 3 further comprising:
- displaying, on the display system, information about the candidate parts displayed in the three-dimensional view.

15. The method of claim 14, wherein the information is selected from at least one of a part number, a type of part, a file name, a material, a certification, a status of the part, manufacturing instructions, or dimensions.

16. The method of claim 3, wherein the prism is selected from one of a rectangular prism, a triangular prism, a hexagonal prism, a cube, and a spherical polyhedron.

17. A computer program product for managing a desired part, such that the computer program product comprises:
- a computer-readable storage device;
- first program code, stored on the computer-readable storage device, specially programmed to retrieve part models based on a number of search parameters for the desired part;
- second program code, stored on the computer-readable storage device, specially programmed to:
  - define, for each of retrieved part models, a prism having a volume that completely contains a volume of a part corresponding to each of the retrieved part models;
  - receive acceptable deviations for each parameter of the number of search parameters, such that the acceptable deviations define a scaled part that comprises a maximum volume boundary for the desired part and a minimum volume boundary for the desired part;
  - select candidate parts from the retrieved part models, such that the candidate parts each comprise a total volume that lies between a total volume of the maximum volume boundary and a total volume of the minimum volume boundary; and eliminate, responsive to a shape analysis, a candidate part from the candidate parts based at least upon a portion of the minimum volume boundary for the desired part lying outside the candidate part, such that the shape analysis comprises:
- a first Boolean logic specially programmed to subtract a shape that comprises the maximum volume boundary, of the desired part, from a shape of the candidate part; and
- a second Boolean logic subtraction of the shape of the candidate part from a shape, that comprises the minimum volume boundary, of the desired part;

third program code, stored on the computer-readable storage device, specially programmed to display, on a display device, an assembly model, which comprises a three-dimensional view, of remaining candidate parts, that comprises the retrieved part models arranged as at least one of: a virtual shelf, a virtual store, and a virtual warehouse, in a side-by-side configuration along a global axis in an order based on a number of characteristics of each prism configured to identify a part model that most closely matches the desired part; and fourth program code, stored on the computer-readable storage device, specially programmed to select, based upon a user input, the part model for the desired part from the three-dimensional view of the remaining candidate parts, such that the desired part comprises a selected part model.

18. A manufacturing system that comprises a product lifecycle management tool configured to:
- retrieve part models from a database based on a number of search parameters, forming retrieved part models;
- define, for each of the retrieved part models, a prism that comprises a volume that completely contains a volume of a part that corresponds to the each of the retrieved part models;
- receive acceptable deviations for each parameter of the number of search parameters, such that the acceptable deviations define a scaled part that comprises a maximum volume boundary for a desired part and a minimum volume boundary for the desired part;
- select candidates parts from the retrieved part model, such that the candidate parts each comprise total volume that lies between a total volume of the maximum volume boundary and a total volume of the minimum volume boundary;
- eliminate, responsive to a shape analysis, a candidate part from the candidate parts based at least upon a portion of the minimum volume boundary for the desired part lying outside the candidate part, such that the shape analysis comprises:
  - a first Boolean logic subtraction of a shape, that comprises the maximum volume boundary, of the desired part, from a shape of the candidate part; and
  - a second Boolean logic subtraction of the shape of the candidate part from a shape, that comprises the minimum volume boundary, of the desired part; and
- display, on a display system, an assembly model, which comprises a three-dimensional view of the candidate parts that comprise the retrieved part models displayed in a side-by-side along a global axis configuration in an order, based on a number of characteristics of each prism, configured to identify a part model that most closely matches a desired part for a selection for reuse.

19. The manufacturing system of claim 18, further comprising:
- the shape analysis comprising either Boolean subtraction comprising a resultant; and
- manufacturing equipment configured to manufacture the desired part using a selected part model.

20. The manufacturing system of claim 18, further comprising:
- the shape analysis comprising at least one of: a boundary of the shape of the candidate part lying outside the maximum volume boundary, or the minimum volume boundary lying outside a boundary of the shape of the candidate part; and
- the part models comprising a model for an existing part for at least one of: an aircraft, a ground vehicle, a spacecraft, a vehicle, a train, a truck, a building, a bridge, and an engine.

* * * * *